US009911661B2

(12) United States Patent
Fu et al.

(10) Patent No.: US 9,911,661 B2
(45) Date of Patent: Mar. 6, 2018

(54) NANO WIRE STRUCTURE AND METHOD FOR FABRICATING THE SAME

(71) Applicant: Taiwan Semiconductor Manufacturing Company, Ltd., Hsinchu (TW)

(72) Inventors: Ching-Feng Fu, Taichung (TW); De-Fang Chen, Hsinchu (TW); Yu-Chan Yen, Taipei (TW); Chia-Ying Lee, New Taipei (TW); Chun-Hung Lee, Hsinchu (TW); Huan-Just Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/680,386

(22) Filed: Aug. 18, 2017

(65) Prior Publication Data

US 2017/0365524 A1    Dec. 21, 2017

Related U.S. Application Data

(60) Continuation of application No. 15/430,174, filed on Feb. 10, 2017, now Pat. No. 9,741,621, which is a
(Continued)

(51) Int. Cl.
*H01L 21/00* (2006.01)
*H01L 21/8234* (2006.01)
(Continued)

(52) U.S. Cl.
CPC .. *H01L 21/823487* (2013.01); *H01L 21/3086* (2013.01); *H01L 21/3088* (2013.01);
(Continued)

(58) Field of Classification Search
CPC ......... H01L 21/823487; H01L 27/0886; H01L 21/3086; H01L 21/3088; H01L 29/0676; H01L 29/42392
See application file for complete search history.

(56) References Cited

U.S. PATENT DOCUMENTS 5,866,302 A    2/1999   Matsuoka et al.
8,350,251 B1   1/2013   Lowgren et al.
(Continued)

FOREIGN PATENT DOCUMENTS

KR    101377795 A    3/2014
TW    201322490 A    6/2013

*Primary Examiner* — Richard Booth
(74) *Attorney, Agent, or Firm* — Slater Matsil, LLP

(57) ABSTRACT

A method includes depositing a sacrificial layer on a first dielectric layer over a substrate; applying a first patterning process, a second patterning process, a third patterning process to the sacrificial layer to form a first group of openings, a second group of openings and a third group of openings, respectively, in the sacrificial layer, wherein three first openings from three different patterning processes form a first side, a second side and a first angle between the first side and the second side, and three second openings from the three different patterning processes form a third side, a fourth side and a second angle between the third side and the fourth side, wherein the first angle is approximately equal to the second angle and forming nanowires based on the first group of openings, the second group of openings and the third group of openings.

20 Claims, 23 Drawing Sheets

Related U.S. Application Data continuation of application No. 15/230,225, filed on Aug. 5, 2016, now Pat. No. 9,570,358, which is a division of application No. 14/290,673, filed on May 29, 2014, now Pat. No. 9,412,614.

(51) Int. Cl.
  *H01L 27/088* (2006.01)
  *H01L 21/308* (2006.01)
  *H01L 29/06* (2006.01)
  *H01L 29/423* (2006.01)

(52) U.S. Cl.
  CPC ...... *H01L 27/0886* (2013.01); *H01L 29/0676* (2013.01); *H01L 29/42392* (2013.01)

(56) References Cited

U.S. PATENT DOCUMENTS

| | | |
|---|---|---|
| 9,000,353 B2 | 4/2015 | Seo et al. |
| 9,412,614 B2 * | 8/2016 | Fu ..................... H01L 21/3086 |
| 9,570,358 B2 * | 2/2017 | Fu ..................... H01L 21/3086 |
| 9,741,621 B2 * | 8/2017 | Fu ................... H01L 21/823487 |
| 2007/0194467 A1 | 8/2007 | Yang et al. |
| 2012/0007052 A1 | 1/2012 | Hobbs et al. |
| 2014/0217502 A1 | 8/2014 | Chang et al. |

* cited by examiner

NANO WIRE STRUCTURE AND METHOD FOR FABRICATING THE SAME

PRIORITY CLAIM AND CROSS-REFERENCE

This application is a continuation of U.S. patent application Ser. No. 15/430,174, entitled "Nano Wire Structure and Method for Fabricating the Same," filed on Feb. 10, 2017, which is a continuation of U.S. patent application Ser. No. 15/230,225, entitled "Nano Wire Structure and Method for Fabricating the Same," filed on Aug. 5, 2016, and issued as U.S. Pat. No. 9,570,358 on Feb. 14, 2017, which is a divisional of U.S. patent application Ser. No. 14/290,673, entitled "Nano Wire Structure and Method for Fabricating the Same," filed on May 29, 2014, and issued as U.S. Pat. No. 9,412,614 on Aug. 9, 2016, all of which are incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may reach the resolution limits of 193-nm lithography. As the demand for even smaller electronic devices has grown recently, there is a need to achieve a high resolution in order to resolve fine, high density, high-resolution patterns.

In order to push the lithographic limit further and to create even smaller semiconductor devices, multiple patterning technology (MPT) techniques are being developed. In a multiple patterning process, a layout of a semiconductor device is decomposed into multiple sub-patterns. Each sub-pattern is defined on a photoresist layer. The sub-pattern in the patterned photoresist layer is transferred to the underlying features of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
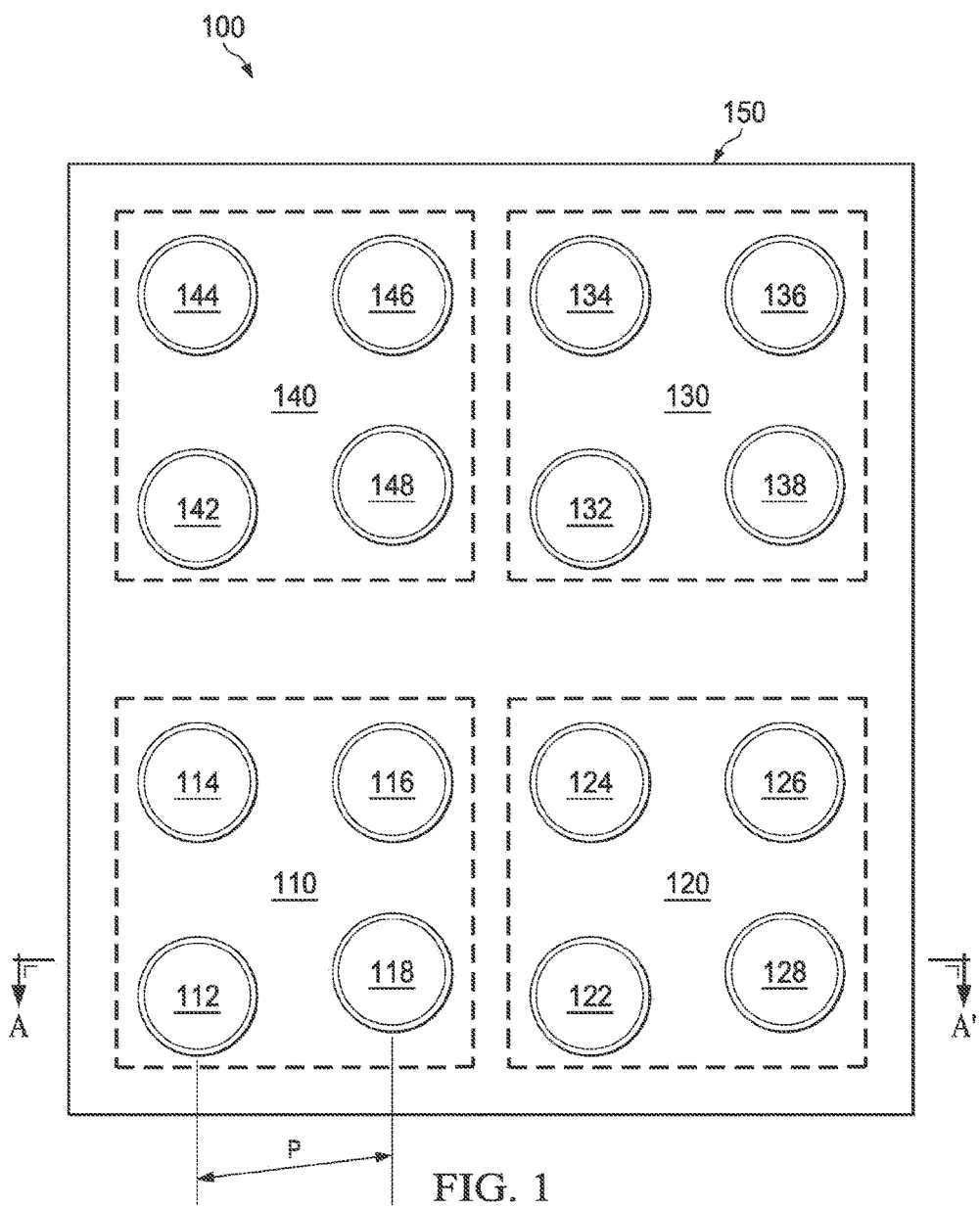
FIG. 1 illustrates a top view of a semiconductor device in accordance with various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a top view of a semiconductor device in accordance with various aspects of the present disclosure. The semiconductor device 100 comprises four vertical gate-all-around transistors 110, 120, 130 and 140. Each vertical gate-all-around transistor (e.g., transistor 110) may comprise four nanowires (e.g., nanowires 112, 114, 116 and 118) The vertical gate-all-around transistors 110, 120, 130 and 140 are formed in an inter-layer dielectric layer 150 as shown in FIG. 1.

The inter-layer dielectric layer 150 may comprise doped or undoped silicon oxide, although other materials such as silicon nitride doped silicate glass, high-k materials, combinations of these, and/or the like, may alternatively be utilized. The inter-layer dielectric layer 150 may be formed by suitable fabrication techniques such as chemical vapor deposition (CVD), sputtering, or any other methods.

As shown in FIG. 1, a first vertical gate-all-around transistor 110 comprises nanowires 112, 114, 116 and 118. A second vertical gate-all-around transistor 120 comprises nanowires 122, 124, 126 and 128. A third vertical gate-all-around transistor 130 comprises nanowires 132, 134, 136 and 138. A fourth vertical gate-all-around transistor 140 comprises nanowires 142, 144, 146 and 148. The structure of the vertical nanowire gate-all-around transistors (e.g., first vertical gate-all-around transistor 110) will be described in further detail below with respect to FIG. 2.

It should be recognized that while FIG. 1 illustrates the semiconductor device 100 with sixteen nanowires, the semiconductor device 100 could accommodate any number of nanowires.

It should further be noted that the nanowires (e.g., nanowire 112) are substantially circular in shape. It is within the scope of various embodiments of the present disclosure for the nanowires to comprise other shapes, such as, but no limited to oval, square, rectangular and/or the like.

FIG. 1 further illustrates a pitch between two adjacent nanowires (e.g., nanowires 112 and 118). The pitch is defined as P as shown in FIG. 1. In some embodiments, P is less than or equal to 20 nm. In alternative embodiments, P is in a range from about 8 nm to about 20 nm. As a result, the nanowires shown in FIG. 1 cannot be formed by using conventional patterning techniques such as a single 193-nm lithography process because the pitch (less than or equal to 20 nm) is beyond the resolution limit of the single 193-nm lithography process, which is about 40 nm.

In some embodiments, the vertical gate-all-around transistors 110, 120, 130 and 140 shown in FIG. 1 are formed through a multiple patterning process. More particularly, a quadruple patterning process is employed to form the vertical gate-all-around transistors 110, 120, 130 and 140. The quadruple patterning process may comprise four masks. Each nanowire of a vertical gate-all-around transistor may correspond to a mask. For example, in the first vertical gate-all-around transistor 110, the nanowire 112 corresponds to a first mask. The nanowire 114 corresponds to a second mask. The nanowire 116 corresponds to a third mask. The nanowire 118 corresponds to a fourth mask.

In other words, the nanowires shown in FIG. 1 having the last digital ending with 2 may form a first lithographic pattern. The first lithographic pattern is printed using the first mask. Likewise, the nanowires shown in FIG. 1 having the last digital ending with 4 may form a second lithographic pattern, which is printed using the second mask. The nanowires shown in FIG. 1 having the last digital ending with 6 may form a third lithographic pattern, which is printed using the third mask. The nanowires shown in FIG. 1 having the last digital ending with 8 may form a fourth lithographic pattern, which is printed using the fourth mask. The detailed fabrication steps of the quadruple patterning process will be described below with respect to FIGS. 11-22.

One advantageous feature of forming the nanowires shown in FIG. 1 through a quadruple patterning process is that the quadruple patterning process helps to solve the narrow pitch patterning issue of a single 193-nm lithography process. In other words, the nanowires shown in FIG. 1 can be divided into four patterns. Each pattern is printed using a mask. As such, the narrow pitch (less than or equal to 20 nm) shown in FIG. 1 can be reliably fabricated through the quadruple patterning process.

Figure 2:
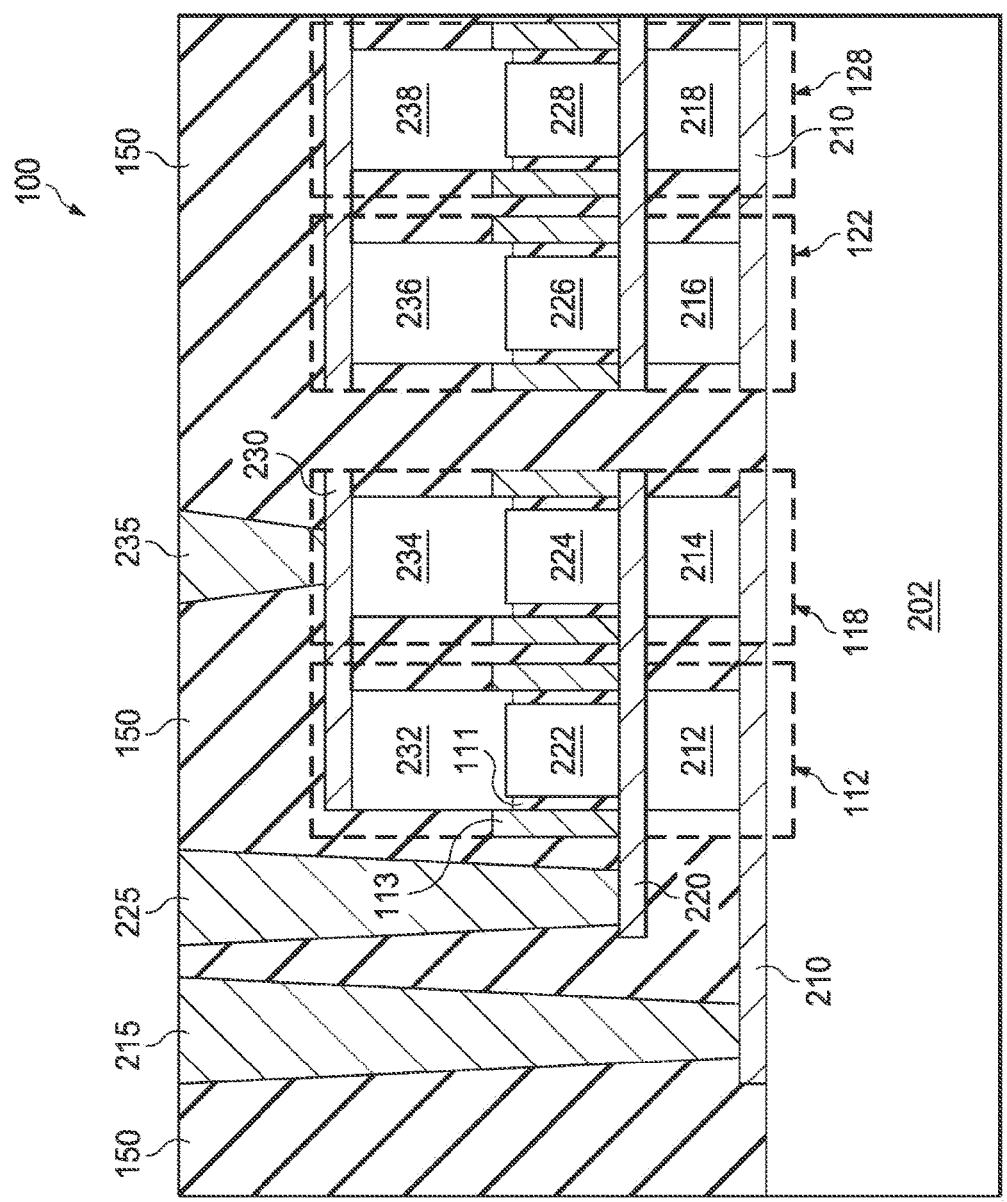
FIG. 2 illustrates a cross sectional view of the semiconductor device shown in FIG. 1 in accordance with various embodiments of the present disclosure.

FIG. 2 illustrates a cross sectional view of the semiconductor device shown in FIG. 1 in accordance with various embodiments of the present disclosure. The cross sectional view is taken along line A-A' shown in FIG. 1. As shown in FIG. 2, there may be four nanowires 112, 118, 122 and 128 formed over a substrate 202. Each nanowire may comprise a first drain/source region (e.g., first drain/source regions 212, 214, 216 and 218), a channel region (e.g., channel regions 222, 224, 226 and 228) formed over a corresponding first drain/source region, a second drain/source region (e.g., second drain/source regions 232, 234, 236 and 238) formed over a corresponding channel region, a gate dielectric layer (e.g., gate dielectric layer 111) wrapping around a corresponding channel region and a gate electrode (e.g., gate electrode 113) wrapping around the gate dielectric layer.

In some embodiments, the first drain/source regions (e.g., the region 212) are a source region. The second drain/source regions (e.g., the region 232) are a drain region. In alternative embodiments, the first drain/source regions are the drain regions. Likewise, the second drain/source regions are the source regions.

The semiconductor device 100 may further comprise a source pad 210, a gate pad 220 and a drain pad 230. As shown in FIG. 2, the source regions 212 and 214 are coupled to the source pad 210 through which the source regions 212 and 214 are connected together and further coupled to a source contact 215. Likewise, the drain regions 232 and 234 are coupled to the drain pad 230 through which the drain regions 232 and 234 are connected together and further coupled to a drain contact 235. The gate electrodes (e.g., gate electrode 113) are coupled to the gate pad 220 through which the gate electrodes are connected together and further coupled to a gate contact 225.

FIG. 2 illustrates the nanowires 112, 118, 122 and 128 are formed over the substrate 202. Furthermore, the nanowires 112, 118, 122 and 128 are embedded in the inter-layer dielectric layer 150. The substrate 202 may be formed of silicon, although it may also be formed of other group III, group IV, and/or group V elements, such as silicon, germanium, gallium, arsenic, any combinations thereof and/or the like. The substrate 202 may comprise bulk silicon, doped or undoped, or an active layer of a silicon-on-insulator (SOI) substrate. Other substrates that may be used include multi-layered substrates, gradient substrates, or hybrid orientation substrates.

The gate dielectrics 111 may be a dielectric material, such as silicon oxide, silicon oxynitride, silicon nitride, an oxide, a nitrogen-containing oxide, a combination thereof, or the like. The gate dielectrics 111 may have a relative permittivity value greater than about 4. Other examples of such materials include aluminum oxide, lanthanum oxide, hafnium oxide, zirconium oxide, hafnium oxynitride, or combinations thereof.

The gate electrode 113 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof, or the like. In an embodiment in which the gate electrode 113 are poly-silicon, the gate electrodes 113 may be formed by depositing doped or undoped poly-silicon by low-pressure chemical vapor deposition (LPCVD).

The first drain/source regions (e.g., drain/source region 212) and the second drain/source regions (e.g., drain/source region 232) may be formed in the nanowires on opposing sides of channel regions (e.g., channel region 222). In some embodiments in which the vertical gate-all-around transistors 110, 120, 130 and 140 are p-type, the drain/source regions (e.g., drain/source regions 212 and 232) may be formed by implanting appropriate p-type dopants such as boron, gallium, indium, or the like. Alternatively, in some embodiments in which the vertical gate-all-around transistors 110, 120, 130 and 140 are n-type, the drain/source regions (e.g., drain/source regions 212 and 232) may be formed by implanting appropriate n-type dopants such as phosphorous, arsenic and/or the like.

The contacts (e.g., the source contact 215) and the pads (e.g., the source pad 210) may be formed through suitable semiconductor fabrication processes such as a damascene process. During the damascene process, a plurality of openings may be etched into the inter-layer dielectric layer 150. A suitable conductive material may be used to fill the openings. The suitable conductive material may be tungsten, copper and/or the like.

It should be noted that the contacts (e.g., the source contact 215) and the pads (e.g., the source pad 210) may comprise one or more conductive layers. For example, the contacts (e.g., the source contact 215) and the pads (e.g., the source pad 210) may include barrier layers, adhesive layers, multiple conductive layers and/or the like.

Figure 3:
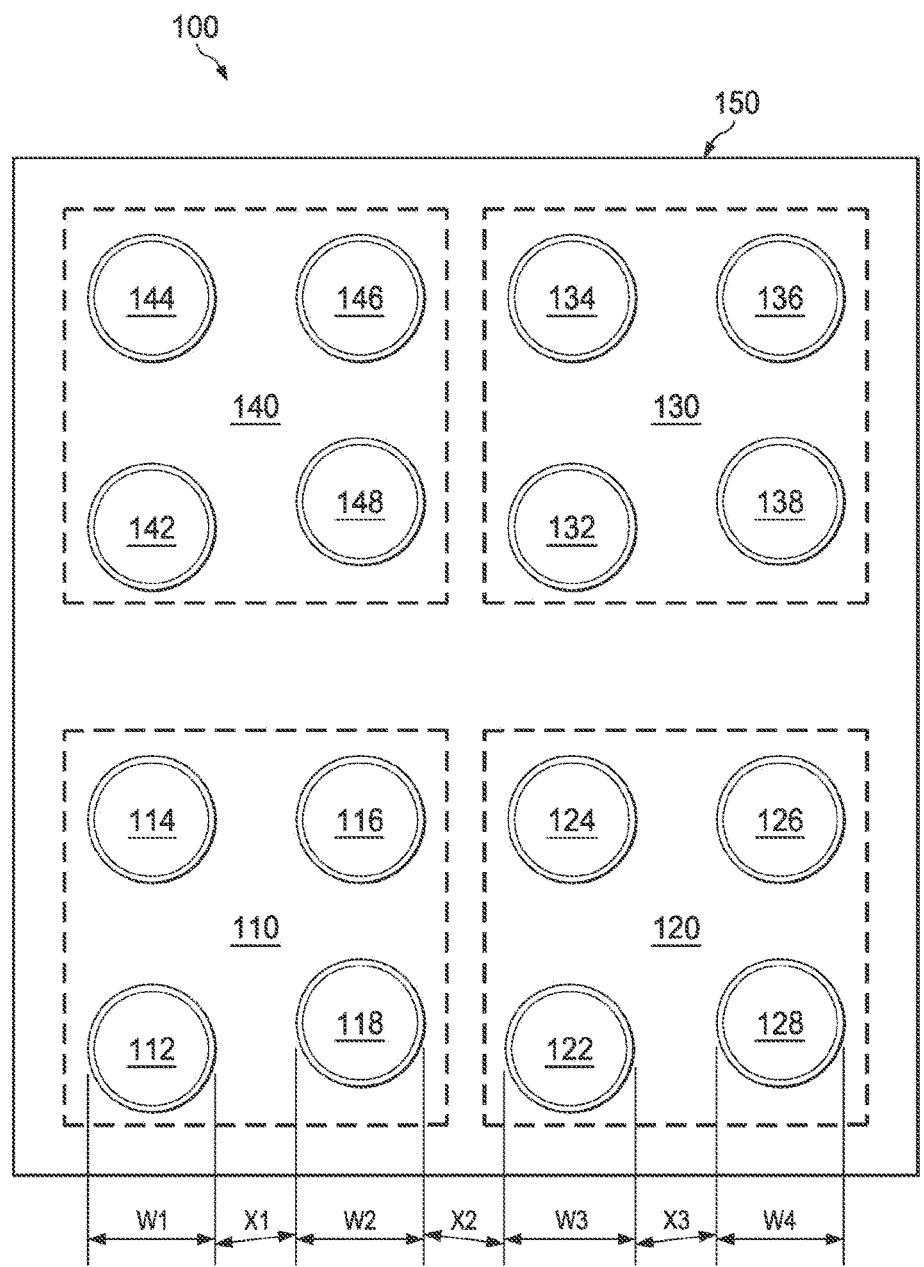
FIG. 3 illustrates a top view including dimensional details in accordance with various embodiments of the present disclosure.

FIG. 3 illustrates a top view including dimensional details in accordance with various embodiments of the present disclosure. As shown in FIG. 3, the diameters of the nanowires 112, 118, 122 and 128 are W1, W2, W3 and W4 respectively. The distance between the nanowires 112 and 118 is defined as X1. The distance between the nanowires 118 and 122 is defined as X2. The distance between the nanowires 122 and 128 is defined as X3.

As described above with respect to FIG. 1, the nanowires having the same last digit are formed in a same patterning process. For example, the nanowires 112 and 122 are formed by using a first mask in a first patterning process. The nanowires 118 and 128 are formed by using a fourth mask in a fourth patterning process. Since the nanowires 112 and 122 are formed by a same mask, W1 is equal to W3. In alternative embodiments, W1 may be approximately equal to W3 due to process variations caused by a variety of factors such as material properties and/or the like. The process variation is in a range from about −2 nm to about 2 nm for a 193-nm lithography process.

Likewise, W2 is equal to W4. In alternative embodiments, W2 may be approximately equal to W4 due to process variations caused by a variety of factors such as material properties and/or the like.

Furthermore, X1 is equal to X3. In alternative embodiments, X1 may be approximately equal to X3 due to process variations caused by a variety of factors such as material properties and/or the like.

Figure 4:
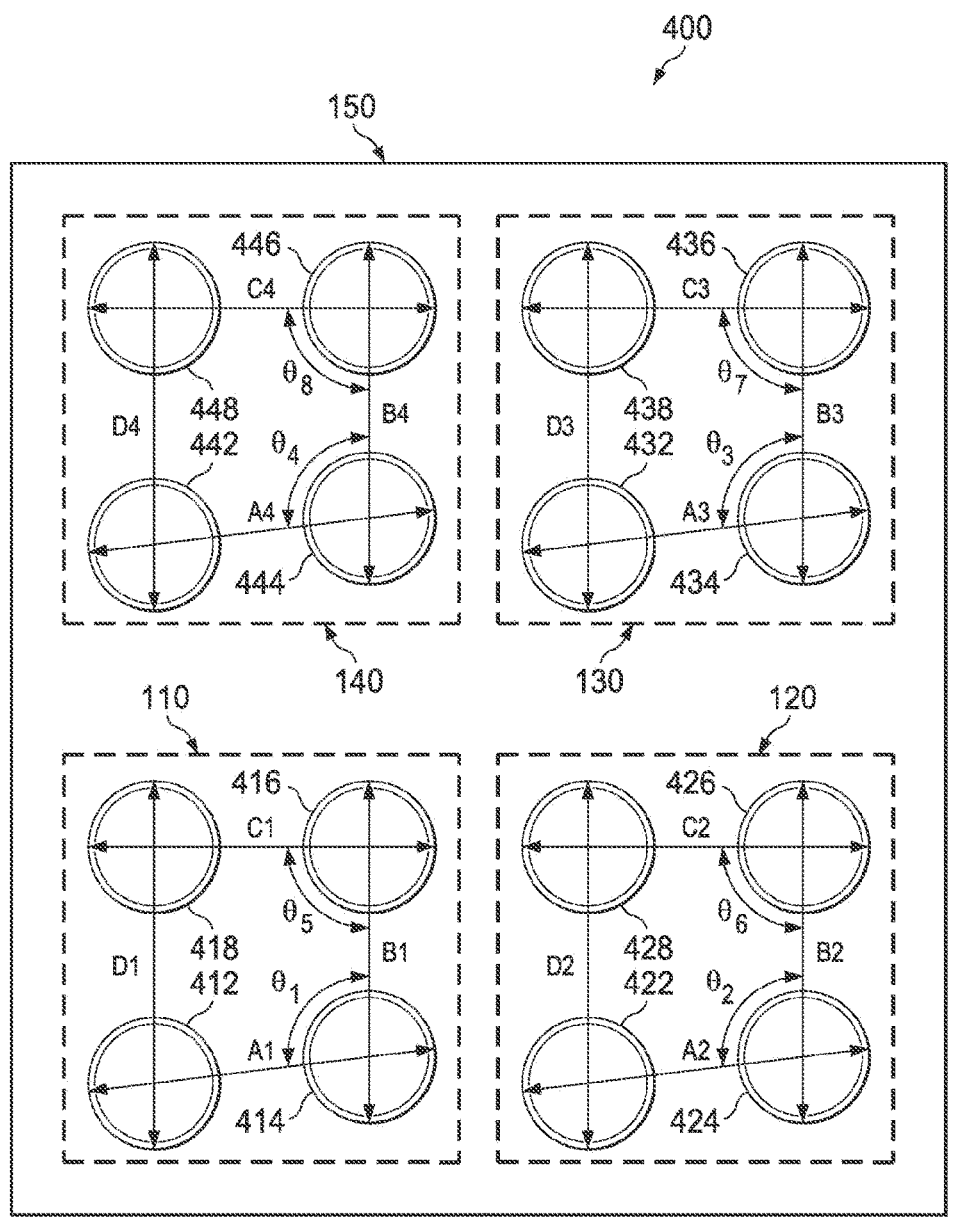
FIG. 4 illustrates another top view including dimensional details in accordance with various embodiments of the present disclosure.

FIG. 4 illustrates another top view including dimensional details in accordance with various embodiments of the present disclosure. The fabrication process of the nanowires 412-418, 422-428, 432-438 and 442-448 are similar to those shown in FIG. 1, and hence is not discussed again to avoid repetition. The semiconductor device 400 comprises four vertical gate-all-around transistors 110, 120, 130 and 140. These four vertical gate-all-around transistors are of the same structure. For simplicity, only the first vertical gate-all-around transistor 110 is described in detail herein.

As shown in FIG. 4, there may be four nanowires 412, 414, 416 and 418 in the first vertical gate-all-around transistor 110. As described above with respect to FIG. 1, these four nanowires 412, 414, 416 and 418 are formed by using four different lithographic patterns. The distance between the nanowires 412 and 414 is defined as A1. The distance between the nanowires 414 and 416 is defined as B1. The distance between the nanowires 416 and 418 is defined as C1. The distance between the nanowires 418 and 412 is defined as D1. The angle between A1 and B1 is defined as θ1. The angle between B1 and C1 is defined as θ5. The definitions of the distances and angles in vertical gate-all-around transistors 120, 130 and 140 are similar to those of the vertical gate-all-around transistor 110, and hence are not discussed again herein.

In some embodiments, the dimensions of the semiconductor device 400 may satisfy the following equations:

$$A1=A2=A3=A4 \qquad (1)$$

$$B1=B2=B3=B4 \qquad (2)$$

$$C1=C2=C3=C4 \qquad (3)$$

$$D1=D2=D3=D4 \qquad (4)$$

$$\theta1=\theta2=\theta3=\theta4 \qquad (5)$$

$$\theta5=\theta6=\theta7=\theta8 \qquad (6)$$

It should be noted while the equations above show one dimension (e.g., A1) is equal to another dimension (e.g., A2), A1 may be approximately equal to A2 due to process variations caused by a variety of factors such as material properties and/or the like.

As shown in FIG. 4, the nanowires of the first vertical gate-all-around transistor 110 form a first pattern. The nanowires of the first vertical gate-all-around transistor 110 may be alternatively referred to as a first group of nanowires. It should be noted that the four nanowires of the first group are immediately neighboring to each other.

Likewise, the nanowires of the second vertical gate-all-around transistor 120 form a second pattern. The nanowires of the second vertical gate-all-around transistor 120 may be alternatively referred to as a second group of nanowires. The nanowires of the third vertical gate-all-around transistor 130 form a second pattern. The nanowires of the third vertical gate-all-around transistor 130 may be alternatively referred to as a third group of nanowires. The nanowires of the fourth vertical gate-all-around transistor 140 form a fourth pattern. The nanowires of the fourth vertical gate-all-around transistor 140 may be alternatively referred to as a fourth group of nanowires. Since the patterns shown in FIG. 4 are of the same dimensions as described above with respect to Equations (1)-(6), these patterns form a repeating pattern as shown in FIG. 4.

It should further be noted that the equal relationship between two dimensions and two angles may vary to some extent due to manufacturing variations. For example, under a 193-nm patterning process, the variation in dimension is in a range from about −2 nm to about 2 nm. The variation in angle is in a range from about −1 degree to about 1 degree.

Figure 5:
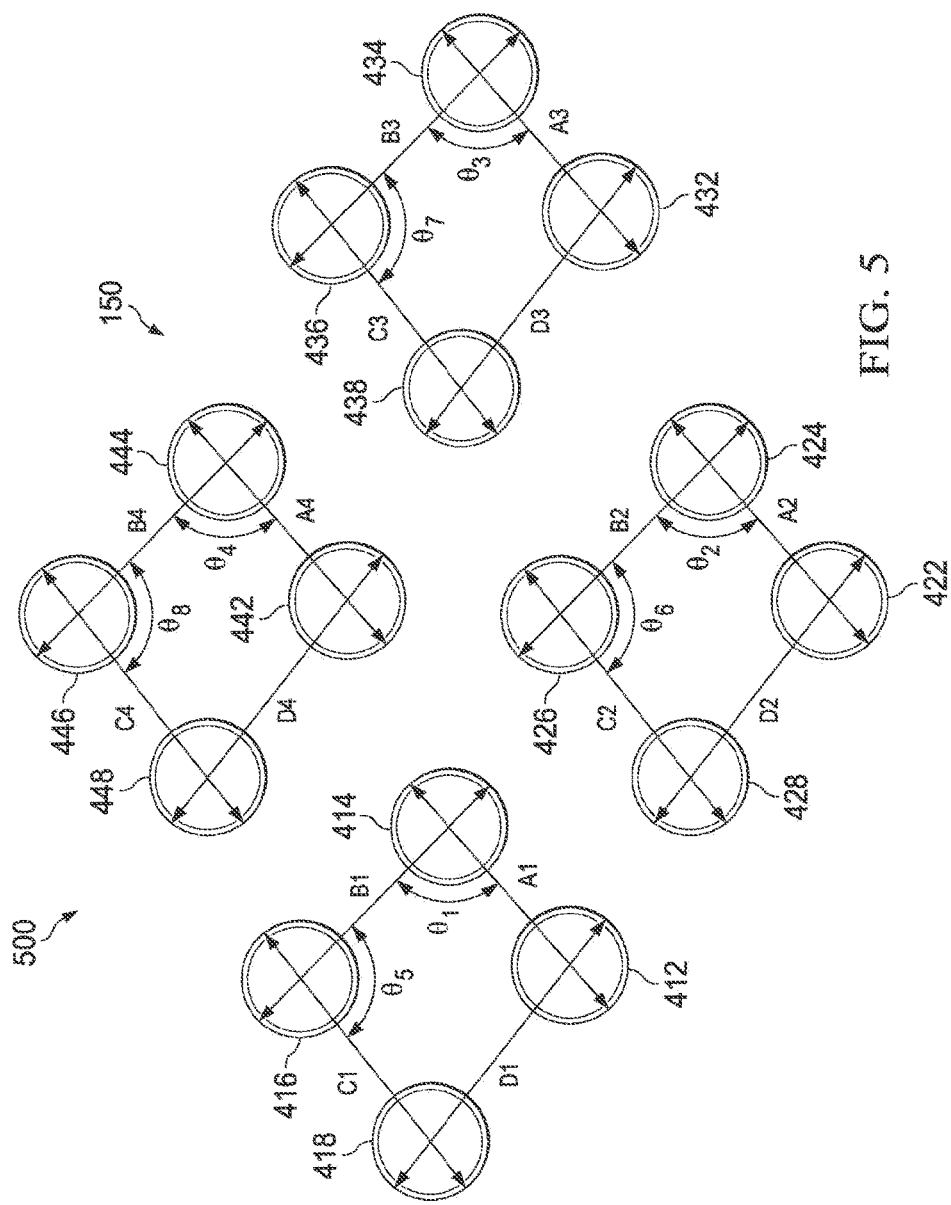
FIG. 5 illustrates yet another top view including dimensional details in accordance with various embodiments of the present disclosure.

FIG. 5 illustrates yet another top view including dimensional details in accordance with various embodiments of the present disclosure. The transistors and their associated nanowires shown in FIG. 5 are similar to those shown in FIG. 4 except that each transistor in FIG. 5 is of a diamond shape rather than a square shape. The dimensions of the semiconductor device 500 may satisfy the following equations:

$$A1=A2=A3=A4 \qquad (7)$$

$$B1=B2=B3=B4 \qquad (8)$$

$$C1=C2=C3=C4 \qquad (9)$$

$$D1=D2=D3=D4 \qquad (10)$$

$$\theta1=\theta2=\theta3=\theta4 \qquad (11)$$

$$\theta5=\theta6=\theta7=\theta8 \qquad (12)$$

It should be noted while the equations above show one dimension (e.g., A1) is equal to another dimension (e.g., A2), A1 may be approximately equal to A2 due to process variations caused by a variety of factors such as material properties and/or the like.

Figure 6:
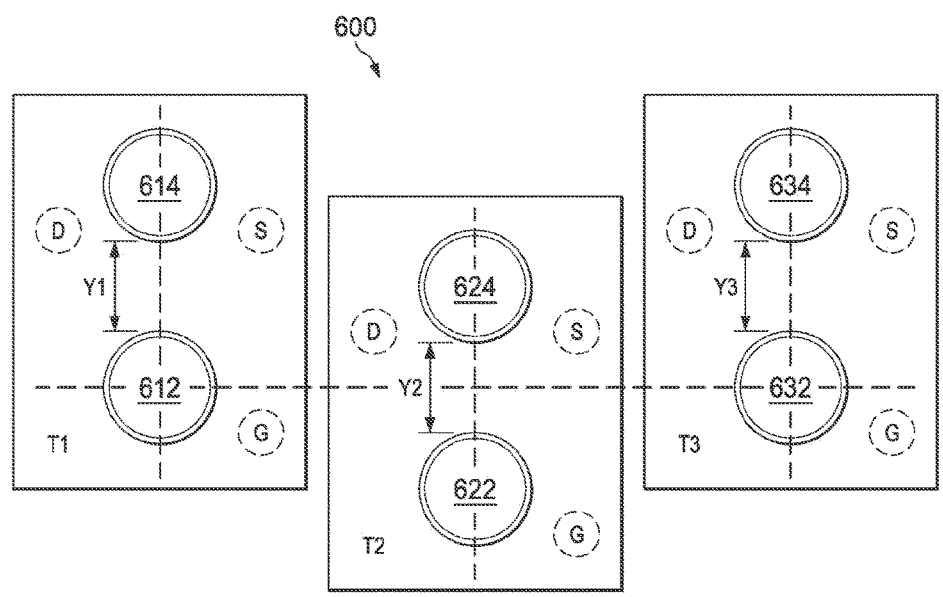
FIG. 6 illustrates a top view of a semiconductor device including transistors formed by two nanowires in accordance with various embodiments of the present disclosure.

FIG. 6 illustrates a top view of a semiconductor device including transistors formed by two nanowires in accordance with various embodiments of the present disclosure. As shown in FIG. 6, there may be three vertical gate-all-around transistors T1, T2 and T3. T1 comprises two nanowires 612 and 614. T1 comprises a drain contact, a source contact and a gate contact as indicated by the dashed circles. Likewise, T2 comprises two nanowires 622 and 624. T3 comprises two nanowires 632 and 634. In some embodiments, the nanowires 612, 622 and 632 are formed by using a first mask. The nanowires 614, 624 and 634 are formed by using a second mask. In other words, the nanowires shown in FIG. 6 are formed by using two different patterning processes.

In some embodiments, the distance between the nanowires 612 and 614 is defined as Y1. The distance between the nanowires 622 and 624 is defined as Y2. The distance between the nanowires 632 and 634 is defined as Y3. The dimensions of the semiconductor device 600 may satisfy the following equations:

$$Y1=Y2=Y3 \tag{13}$$

It should be noted while the equation above show one dimension (e.g., Y1) is equal to another dimension (e.g., Y2), Y1 may be approximately equal to Y2 due to process variations caused by a variety of factors such as material properties and/or the like.

Figure 7:
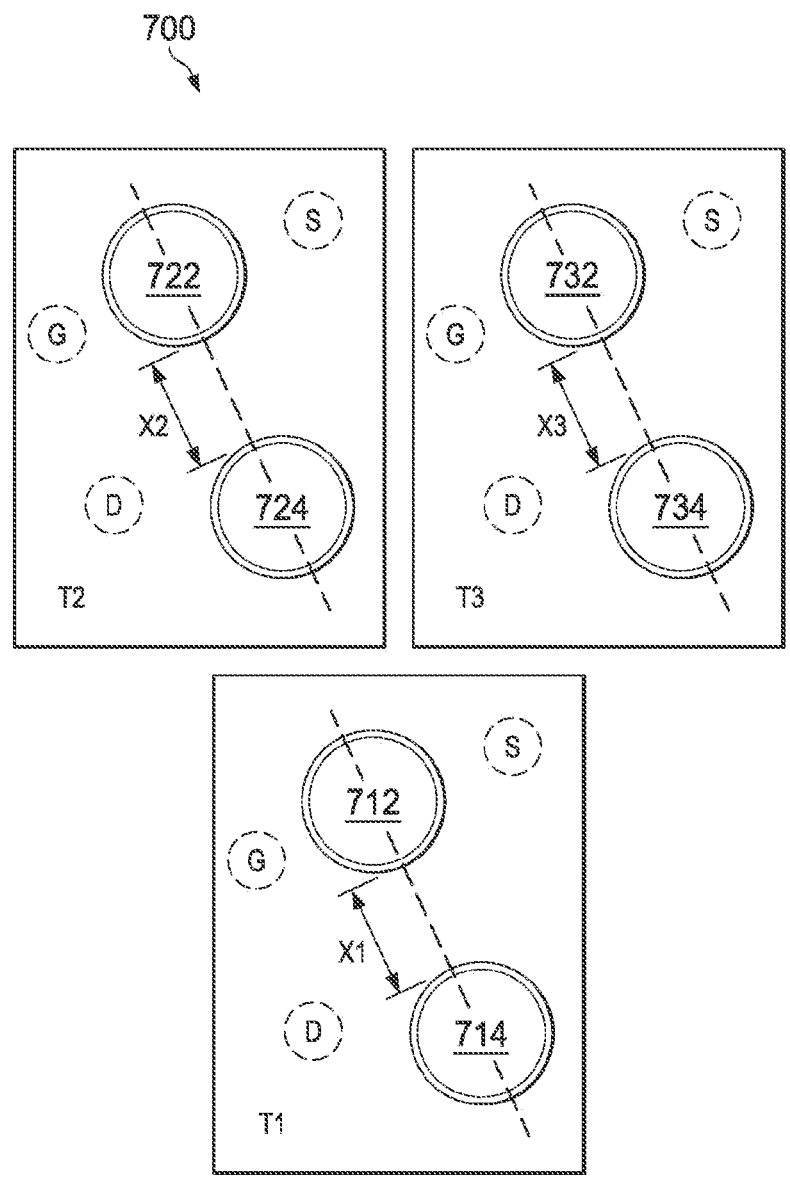
FIG. 7 illustrates a top view of another semiconductor device including transistors formed by two nanowires in accordance with various embodiments of the present disclosure.

FIG. 7 illustrates a top view of another semiconductor device including transistors formed by two nanowires in accordance with various embodiments of the present disclosure. As shown in FIG. 7, there may be three vertical gate-all-around transistors T1, T2 and T3. T1 may comprise two nanowires 712 and 714. T2 may comprise two nanowires 722 and 724. T3 may comprise two nanowires 732 and 734. In some embodiments, the nanowires 712, 722 and 732 are formed by using a first mask. The nanowires 714, 724 and 734 are formed by using a second mask. In other words, the nanowires shown in FIG. 7 are formed by using two different patterning processes.

In some embodiments, the distance between the nanowires 712 and 714 is defined as X1. The distance between the nanowires 722 and 724 is defined as X2. The distance between the nanowires 732 and 734 is defined as X3. The dimensions of the semiconductor device 700 may satisfy the following equations:

$$X1=X2=X3 \tag{14}$$

It should be noted while the equation above show one dimension (e.g., X1) is equal to another dimension (e.g., X2), X1 may be approximately equal to X2 due to process variations caused by a variety of factors such as material properties and/or the like.

Figure 8:
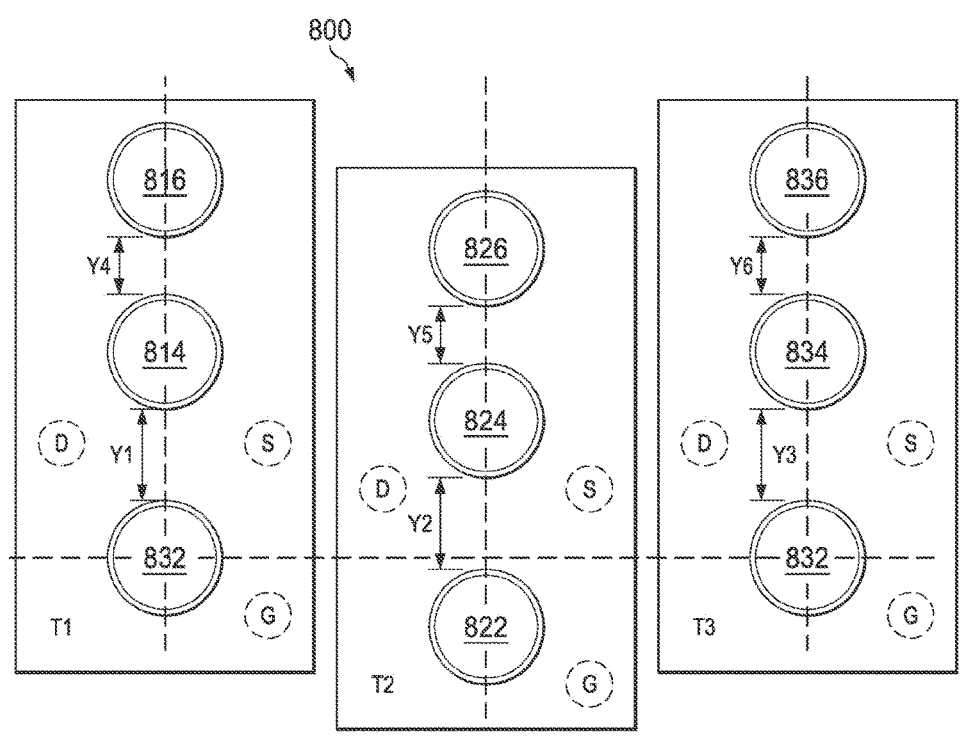
FIG. 8 illustrates a top view of a semiconductor device including a transistor formed by three nanowires in accordance with various embodiments of the present disclosure.

FIG. 8 illustrates a top view of a semiconductor device including a transistor formed by three nanowires in accordance with various embodiments of the present disclosure. As shown in FIG. 8, there may be three vertical gate-all-around transistors T1, T2 and T3. T1 may comprise three nanowires 812, 814 and 816, which are vertically aligned with each other. T2 may comprise three nanowires 822, 824 and 826, which are vertically aligned with each other. T3 may comprise three nanowires 832, 834 and 836, which are vertically aligned with each other.

In some embodiments, the nanowires 812, 822 and 832 are formed by using a first mask. The nanowires 814, 824 and 834 are formed by using a second mask. The nanowires 816, 826 and 836 are formed by using a third mask. In other words, the nanowires shown in FIG. 8 are formed by using a triple patterning process.

In some embodiments, the distance between the nanowires 812 and 814 is defined as Y1. The distance between the nanowires 822 and 824 is defined as Y2. The distance between the nanowires 832 and 834 is defined as Y3. The distance between the nanowires 814 and 816 is defined as Y4. The distance between the nanowires 824 and 826 is defined as Y5. The distance between the nanowires 834 and 836 is defined as Y6. The dimensions of the semiconductor device 800 may satisfy the following equations:

$$Y1=Y2=Y3 \tag{15}$$

$$Y4=Y5=Y6 \tag{16}$$

It should be noted while the equations above show one dimension (e.g., Y1) is equal to another dimension (e.g., Y2), Y1 may be approximately equal to Y2 due to process variations caused by a variety of factors such as material properties and/or the like.

Figure 9:
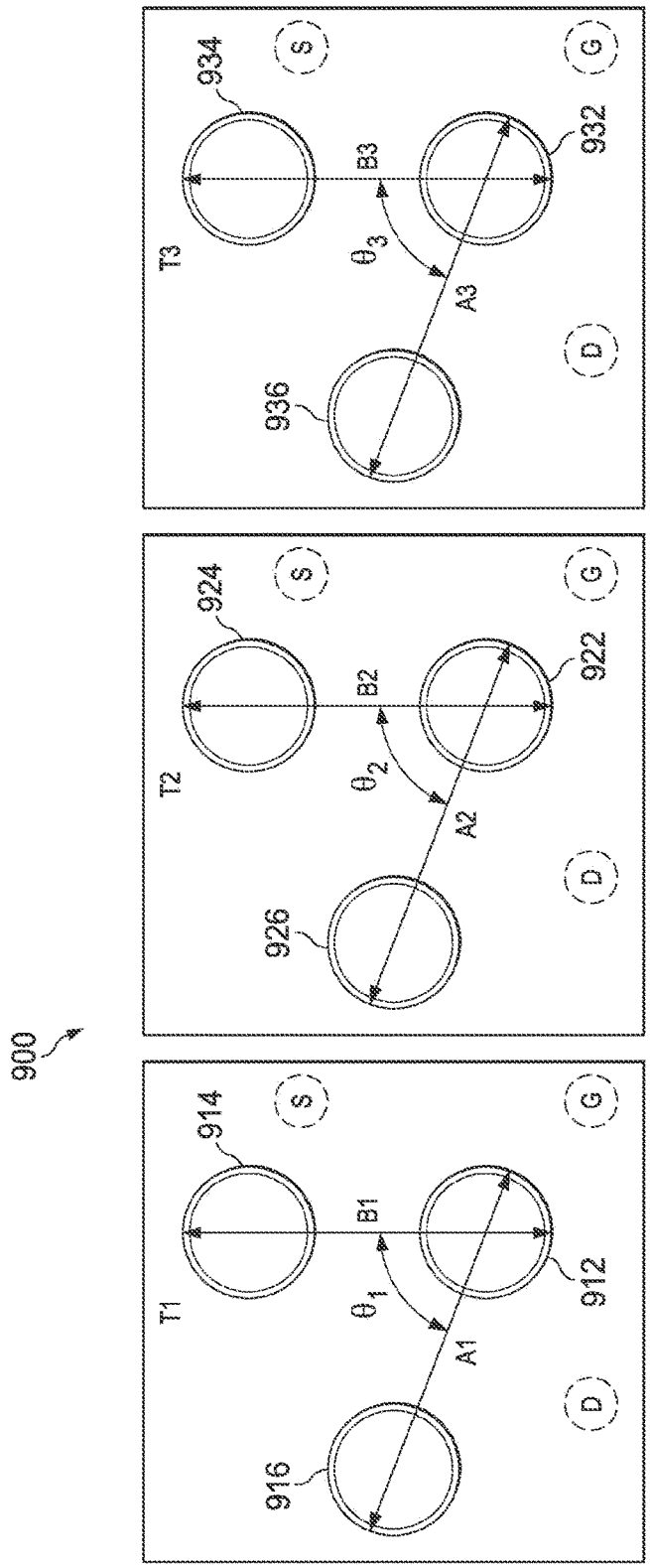
FIG. 9 illustrates a top view of another semiconductor device including a transistor formed by three nanowires in accordance with various embodiments of the present disclosure.

FIG. 9 illustrates a top view of another semiconductor device including a transistor formed by three nanowires in accordance with various embodiments of the present disclosure. The vertical gate-all-around transistors (e.g., T1) and their associated nanowires (e.g., nanowires 912, 914 and 916) shown in FIG. 9 are similar to the vertical gate-all-around transistors (e.g., T1) and their associated nanowires (e.g., nanowires 812, 814 and 816 shown in FIG. 8 except that the nanowires (e.g., nanowires 912, 914 and 916) in FIG. 9 form a triangle shape rather than a straight line. The dimensions of the semiconductor device 900 may satisfy the following equations:

$$A1=A2=A3 \tag{17}$$

$$B1=B2=B3 \tag{18}$$

$$\theta1=\theta2=\theta3 \tag{19}$$

It should be noted while the equations above show one dimension (e.g., A1) is equal to another dimension (e.g., A2), A1 may be approximately equal to A2 due to process variations caused by a variety of factors such as material properties and/or the like.

Figure 10:
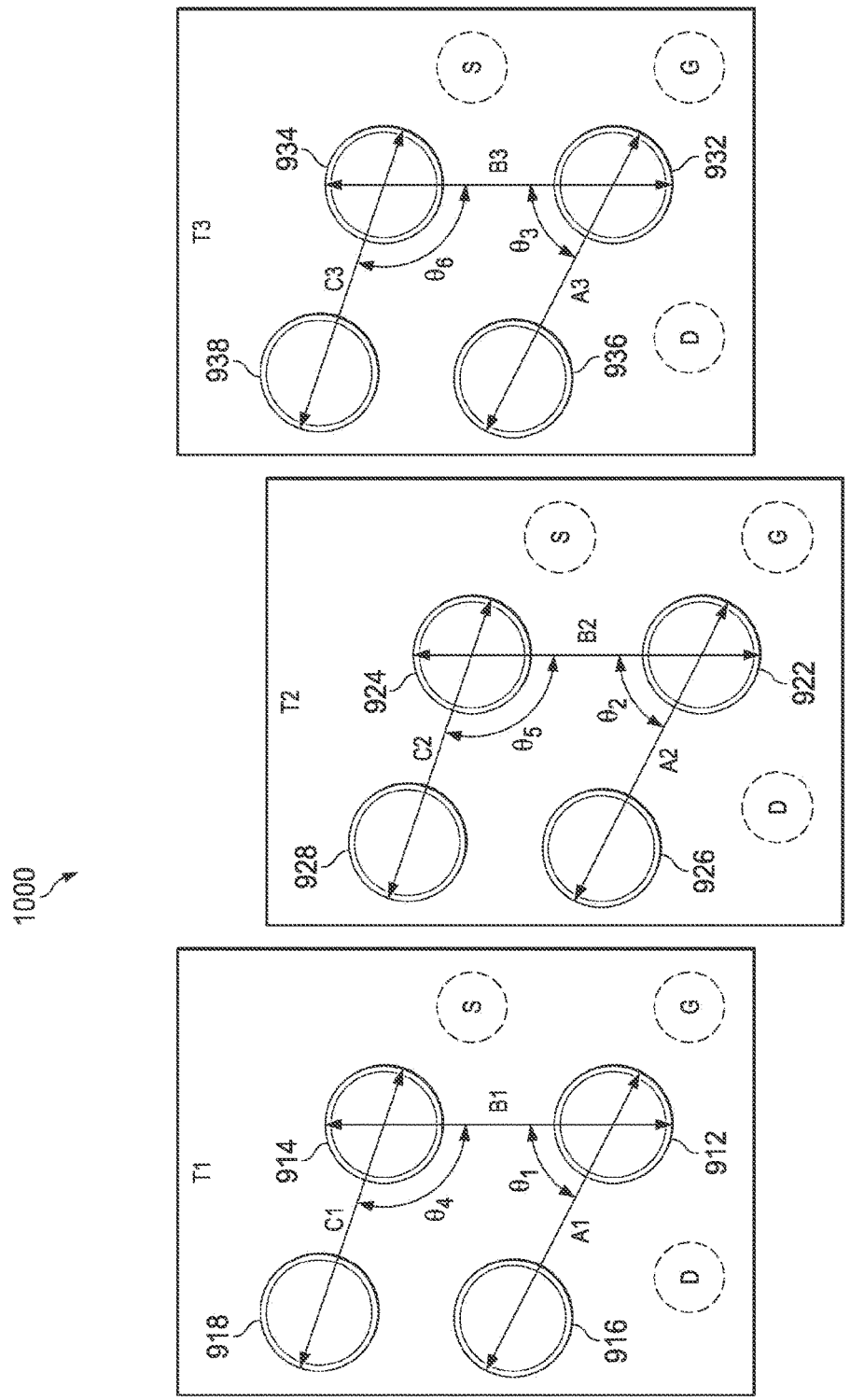
FIG. 10 illustrates a top view of a semiconductor device including a transistor formed by four nanowires in accordance with various embodiments of the present disclosure.

FIG. 10 illustrates a top view of a semiconductor device including a transistor formed by four nanowires in accordance with various embodiments of the present disclosure. The vertical gate-all-around transistors (e.g., T1) shown in FIG. 10 are similar to the vertical gate-all-around transistors (e.g., T1) shown in FIG. 9 except that the vertical gate-all-around transistors in FIG. 10 may comprise one more nanowire (e.g., nanowire 918).

In some embodiments, the additional nanowires 918, 928 and 938 are formed by a fourth mask. In other words, the semiconductor device 1000 shown in FIG. 10 is formed by using a quadruple patterning process. In addition, the four nanowires in each vertical gate-all-around transistor (e.g., nanowires 912, 914, 916 and 918) may form a quadrilateral as shown in FIG. 10. The dimensions of the semiconductor device 1000 may satisfy the following equations:

$$A1=A2=A3 \tag{20}$$

$$B1=B2=B3 \tag{21}$$

$$C1=C2=C3 \tag{22}$$

$$\theta1=\theta2=\theta3 \tag{23}$$

04=05=06 (24)

It should be noted while the equations above show one dimension (e.g., A1) is equal to another dimension (e.g., A2), A1 may be approximately equal to A2 due to process variations caused by a variety of factors such as material properties and/or the like.

Figure 11A:
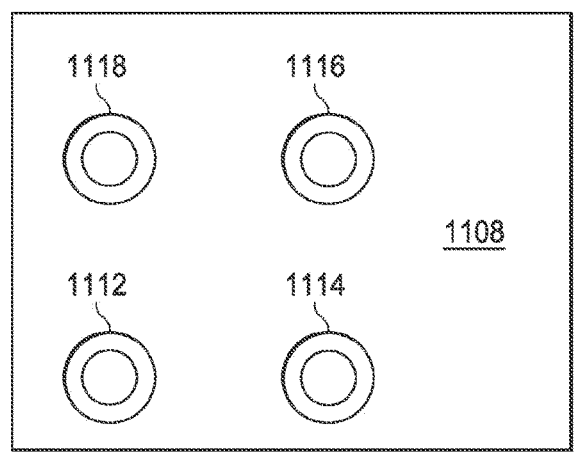
FIGS. 11A-22B illustrate intermediate steps of fabricating the semiconductor device shown in FIG. 4 in accordance with various embodiments of the present disclosure.
Figure 11B:
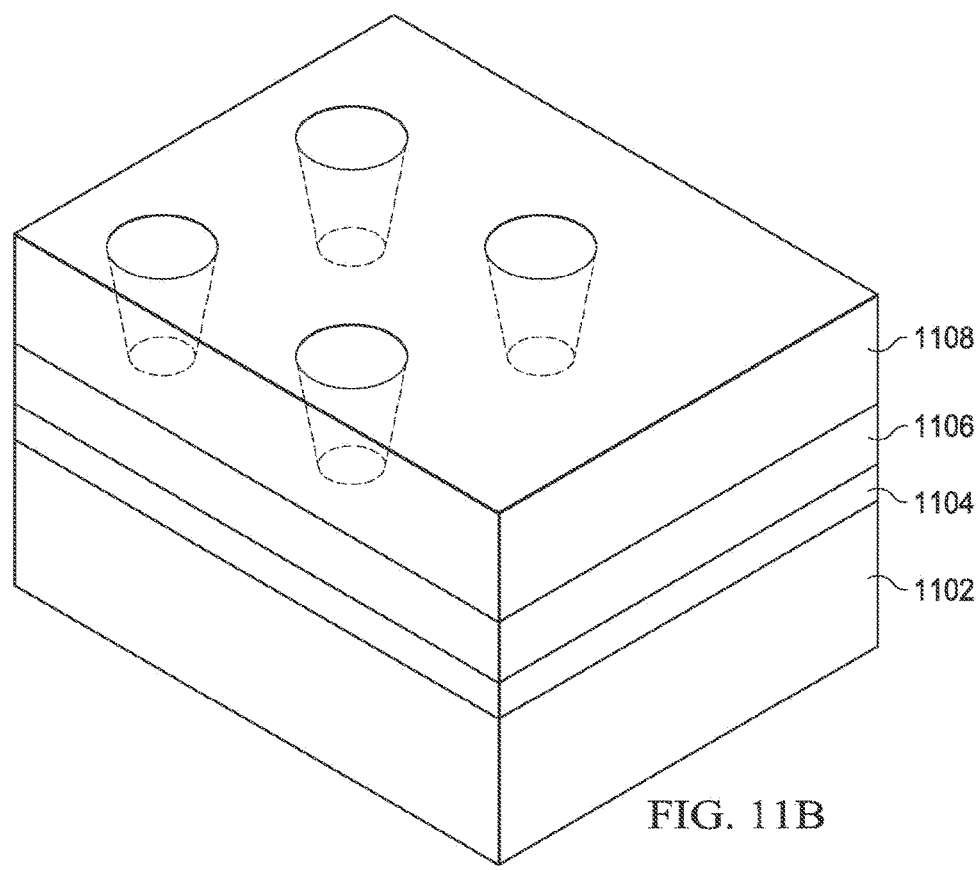

FIGS. 11-22 illustrate intermediate steps of fabricating the semiconductor device shown in FIG. 4 in accordance with various embodiments of the present disclosure. FIG. 11 illustrates a top view and a perspective view of a semiconductor device after a first patterning process is applied to the semiconductor device in accordance with various embodiments of the present disclosure. The perspective view shows a dielectric layer 1104 is formed over a substrate 1102. A sacrificial layer 1106 is formed over the dielectric layer 1104.

In some embodiments, the dielectric layer 1104 may be an oxide layer. The oxide layer 1104 may be formed of silicon oxide and/or other oxides. The oxide layer 1104 may also be formed using CVD, plasma enhanced chemical vapor deposition (PECVD) and/or the like. The sacrificial layer 1106 may be formed of suitable semiconductor materials such as amorphous silicon and/or the like. The sacrificial layer may also be formed by suitable deposition techniques such as PECVD and/or the like.

A photoresist layer 1108 is formed over the sacrificial layer 1106 through suitable deposition techniques. In consideration of the pattern of the nanowires 412, 422, 432 and 442 shown in FIG. 4, selective areas of the photoresist layer 1108 are exposed to light. More particularly, the photoresist layer 1108 may be patterned by exposing the layer to light through a first mask. As a result, the photoresist material in the opening 1112, 1114, 1116 and 1118 shown in the top view is removed and a variety of openings (e.g., opening 1112-1118) are formed on top of the sacrificial layer 1106. The formation of the openings such as opening 1112 in the photoresist layer 1108 involves lithography operations, which are well known, and hence are not discussed in further detail herein.

Figure 12A:
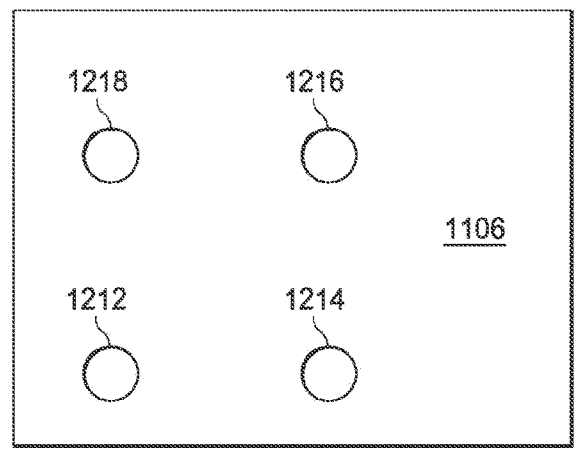
Figure 12B:
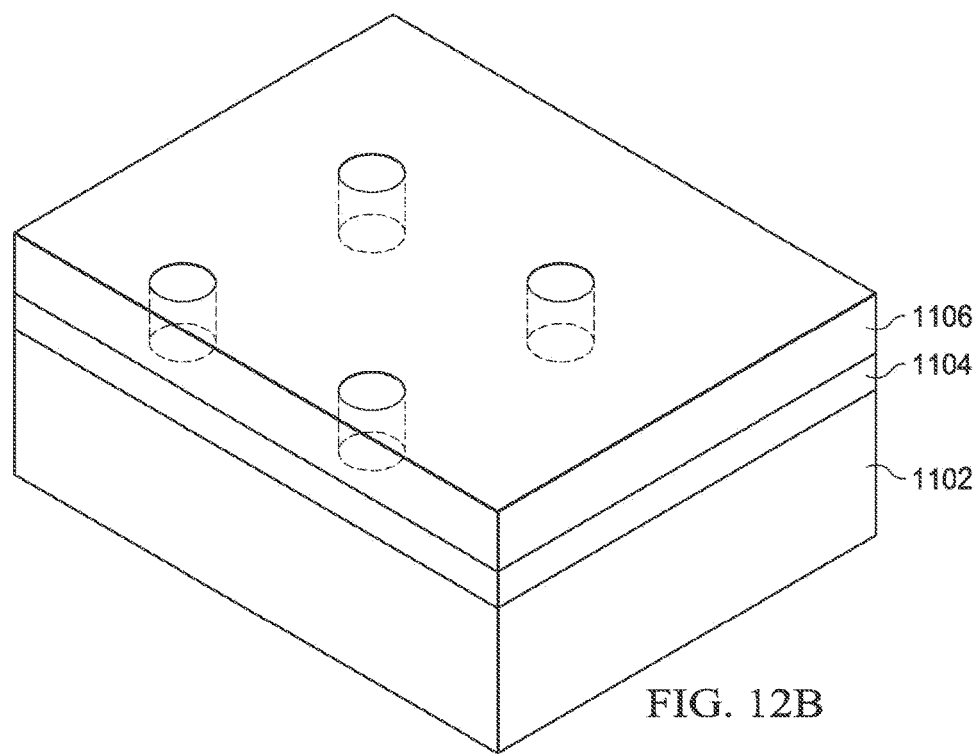

FIG. 12 illustrates a top view and a perspective view of the semiconductor device shown in FIG. 11 after an etching process is applied to the semiconductor device in accordance with various embodiments of the present disclosure. An etching process may be applied to the exposed portions of the sacrificial layer 1106 to form the openings 1212, 1214, 1216 and 1218 in the sacrificial layer 1106. The remaining photoresist layer shown in FIG. 11 may be removed by using suitable photoresist stripping techniques such as chemical solvent cleaning, plasma ashing, dry stripping and/or the like. The photoresist stripping techniques are well known and hence are not discussed in further detail herein to avoid repetition.

Figure 13A:
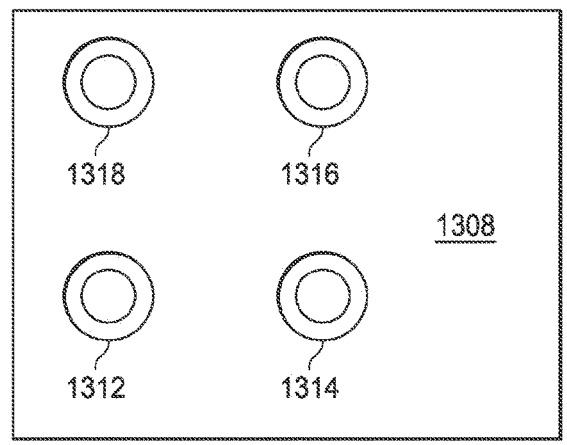
Figure 13B:
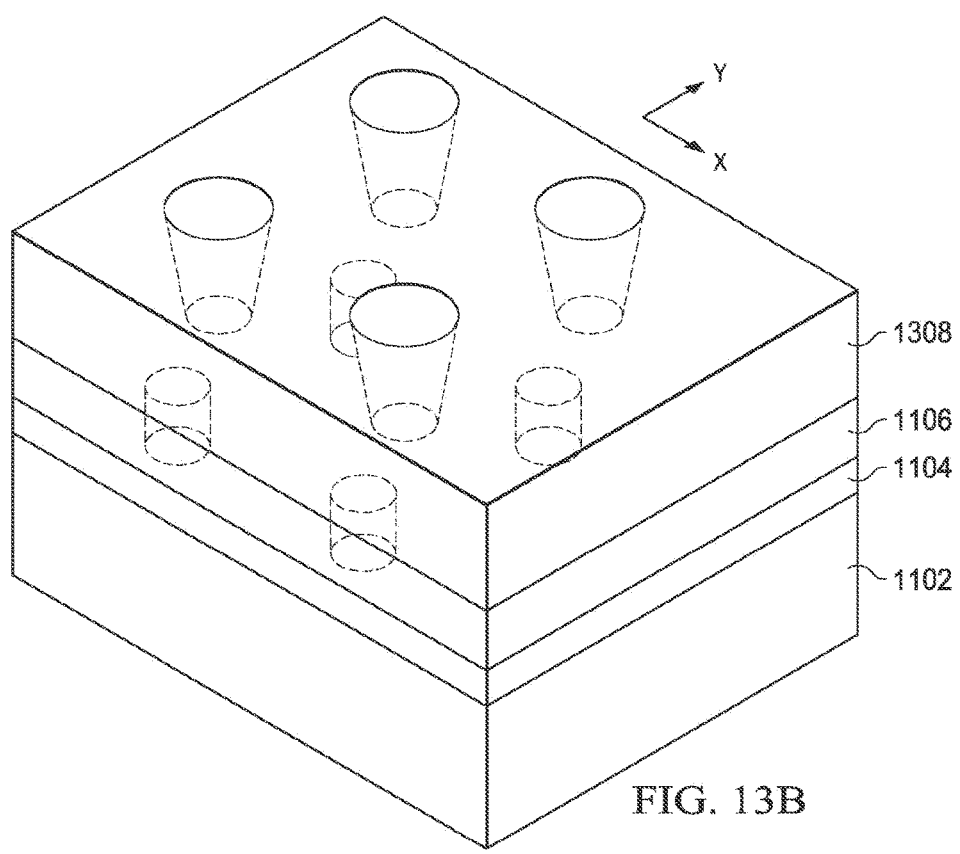

FIG. 13 illustrates a top view and a perspective view of the semiconductor device shown in FIG. 12 after a second patterning process is applied to the semiconductor device in accordance with various embodiments of the present disclosure. A photoresist layer 1308 is formed over the sacrificial layer 1106. The formation of the photoresist layer 1308 is similar to that of the photoresist layer 1108 shown in FIG. 11, and hence is not discussed herein to avoid repetition.

A second patterning process is performed on the photoresist layer 1308 to form the openings 1312, 1314, 1316 and 1318 as shown in FIG. 13. The second patterning process is similar to the first patterning process described above with respect to FIG. 11 except that the pattern is shifted in the y-direction as shown in the perspective view of the semiconductor device.

Figure 14A:
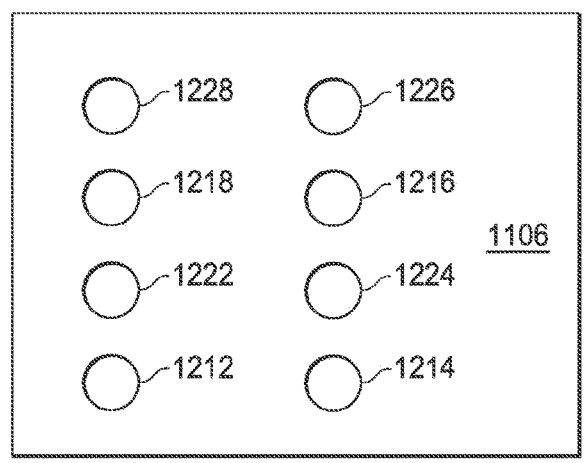
Figure 14B:
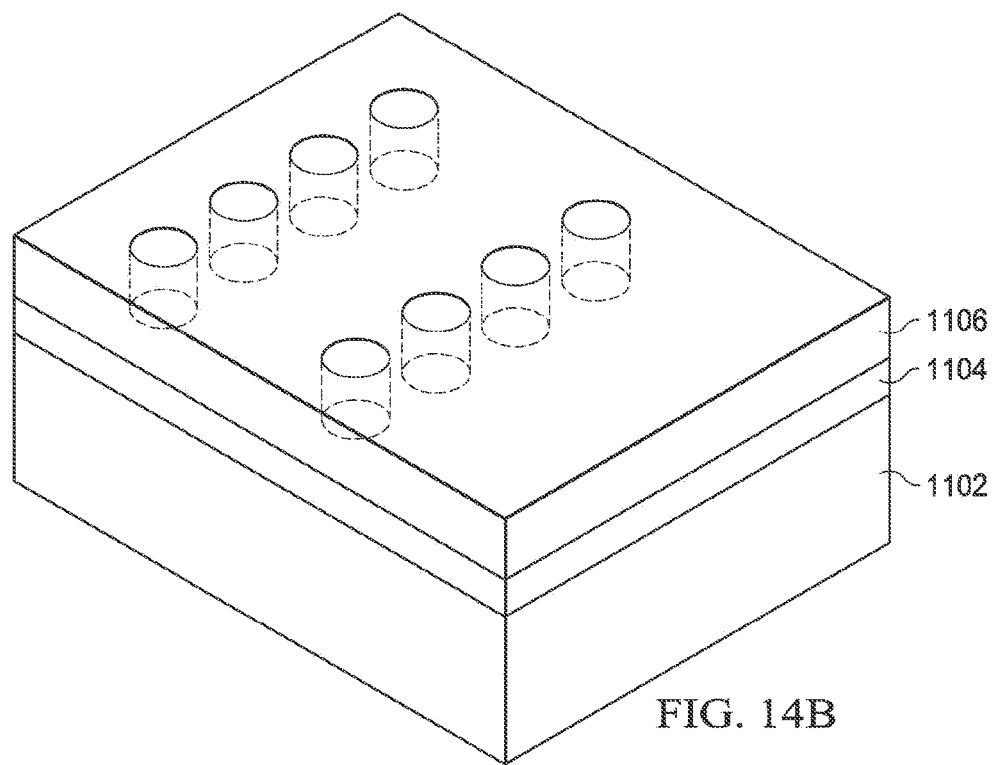

FIG. 14 illustrates a top view and a perspective view of the semiconductor device shown in FIG. 13 after an etching process and a photoresist removal process are applied to the semiconductor device in accordance with various embodiments of the present disclosure. An etching process may be applied to the exposed portions of the sacrificial layer 1106 to form the openings 1222, 1224, 1226 and 1228 in the sacrificial layer 1106. As shown in the top view of FIG. 14, the openings (e.g., 1222 and 1228) formed by the second patterning process and the openings (e.g., 1212 and 1218) formed by the first patterning process are arranged in an alternating manner.

The remaining photoresist layer shown in FIG. 13 may be removed by using suitable photoresist stripping techniques such as chemical solvent cleaning, plasma ashing, dry stripping and/or the like.

Figure 15A:
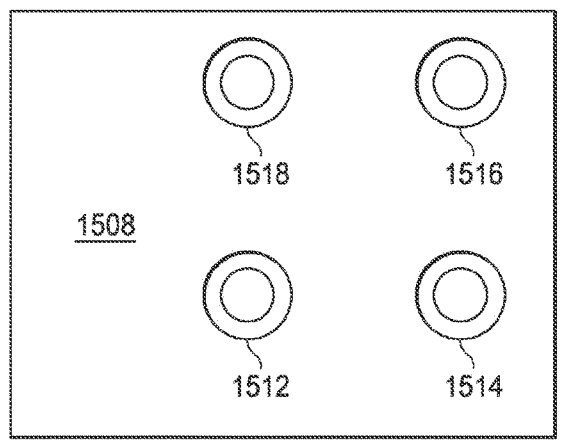
Figure 15B:
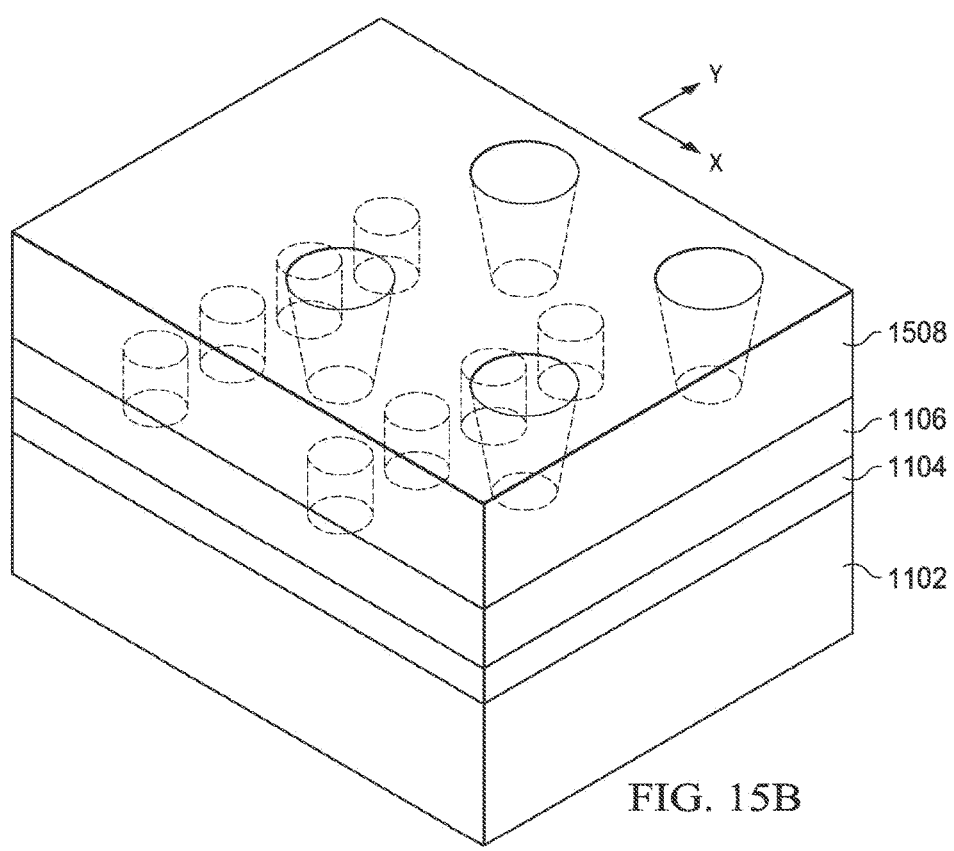

FIG. 15 illustrates a top view and a perspective view of the semiconductor device shown in FIG. 14 after a third patterning process is applied to the semiconductor device in accordance with various embodiments of the present disclosure. A photoresist layer 1508 is formed over the sacrificial layer 1106. The formation of the photoresist layer 1508 is similar to that of the photoresist layer 1108 shown in FIG. 11, and hence is not discussed herein to avoid repetition.

A third patterning process is performed on the photoresist layer 1508 to form the openings 1512, 1514, 1516 and 1518. The third patterning process is similar to the first patterning process described above with respect to FIG. 11 except that the pattern is shifted in the x-direction as shown in the perspective view of the semiconductor device.

Figure 16A:
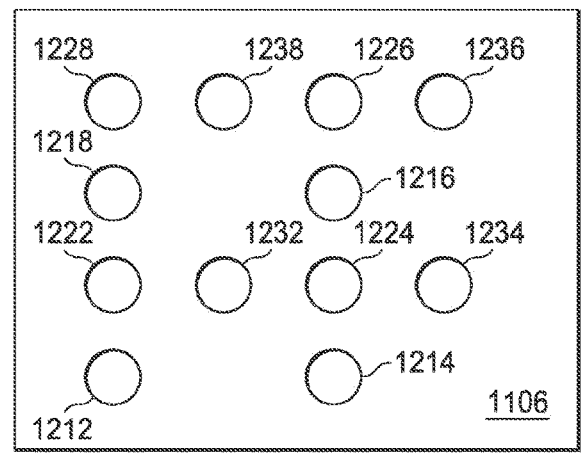
Figure 16B:
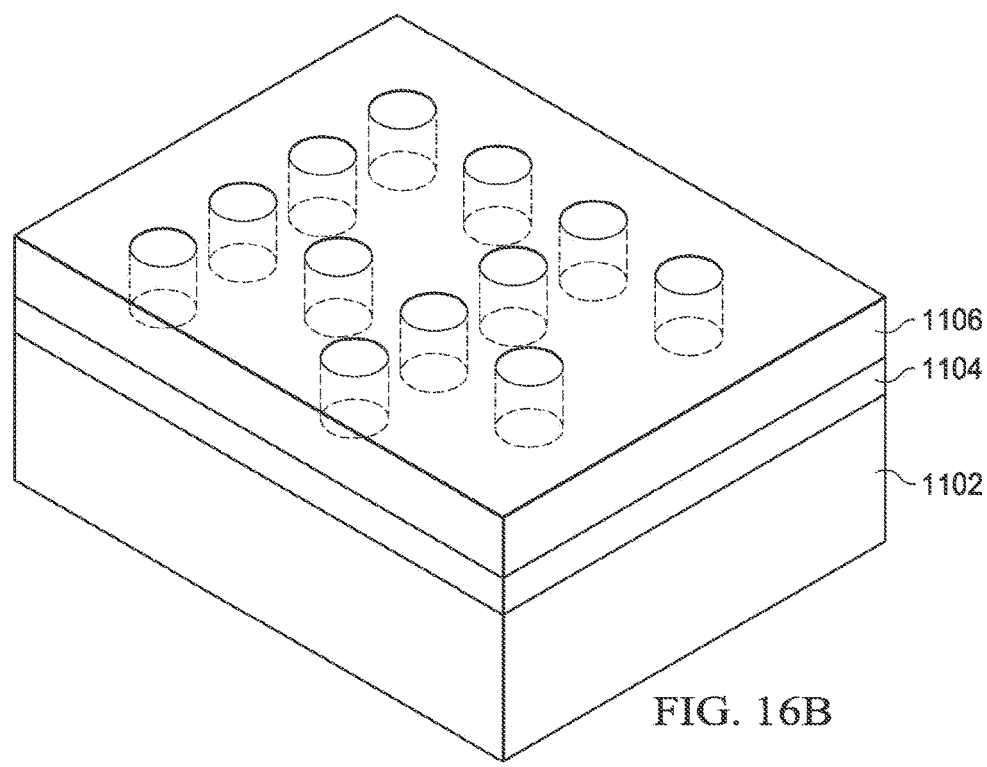

FIG. 16 illustrates a top view and a perspective view of the semiconductor device shown in FIG. 15 after an etching process and a photoresist removal process are applied to the semiconductor device in accordance with various embodiments of the present disclosure. An etching process may be applied to the exposed portions of the sacrificial layer 1106 to form the openings 1232, 1234, 1236 and 1238 in the sacrificial layer 1106. As shown in the top view of FIG. 16, the openings (e.g., 1236 and 1238) formed by the third patterning process and the openings (e.g., 1226 and 1228) formed by the second patterning process are arranged in an alternating manner.

The remaining photoresist layer shown in FIG. 15 may be removed by using suitable photoresist stripping techniques such as chemical solvent cleaning, plasma ashing, dry stripping and/or the like.

Figure 17A:
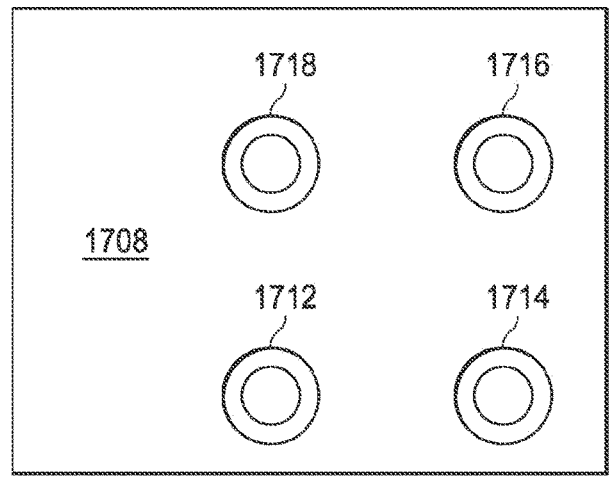
Figure 17B:
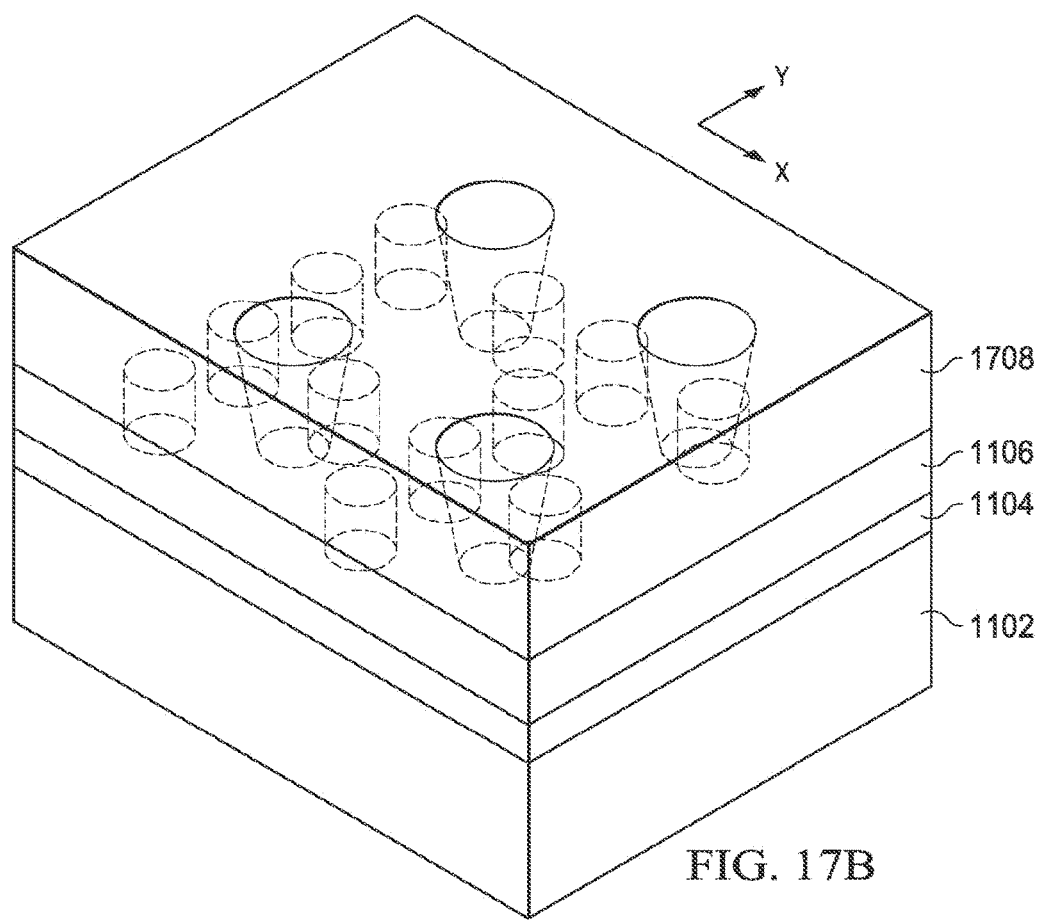

FIG. 17 illustrates a top view and a perspective view of the semiconductor device shown in FIG. 16 after a fourth patterning process is applied to the semiconductor device in accordance with various embodiments of the present disclosure. A photoresist layer 1708 is formed over the sacrificial layer 1106. The formation of the photoresist layer 1708 is similar to that of the photoresist layer 1108 shown in FIG. 11, and hence is not discussed herein to avoid repetition.

A fourth patterning process is performed on the photoresist layer 1708 to form the openings 1712, 1714, 1716 and 1718. The fourth patterning process is similar to the first patterning process described above with respect to FIG. 11 except that the pattern is shifted in the y-direction as shown in the perspective view of the semiconductor device.

Figure 18A:
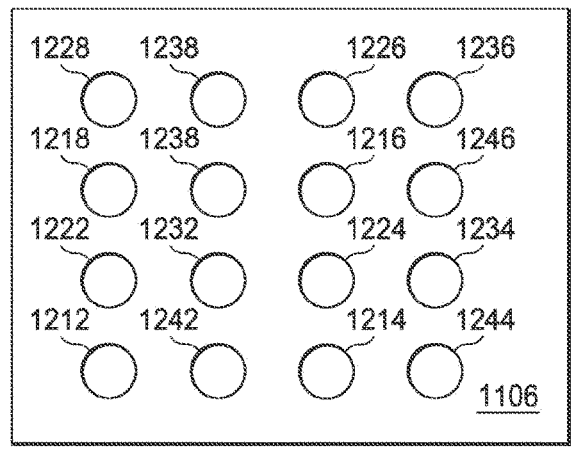
Figure 18B:
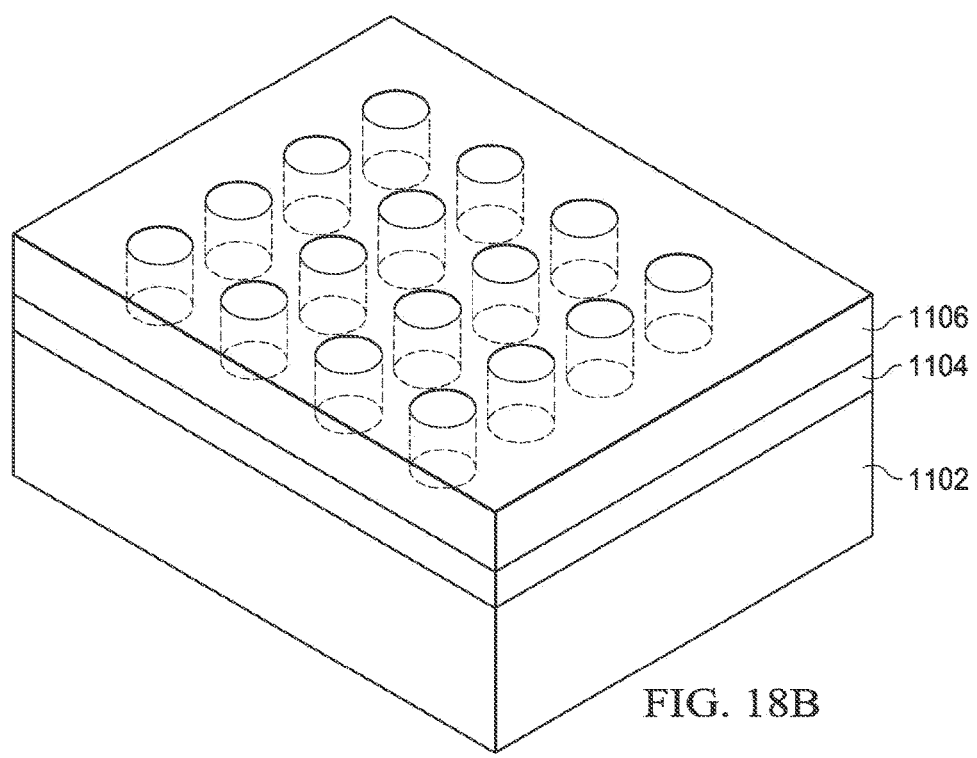

FIG. 18 illustrates a top view and a perspective view of the semiconductor device shown in FIG. 17 after an etching process and a photoresist removal process are applied to the semiconductor device in accordance with various embodiments of the present disclosure. An etching process may be applied to the exposed portions of the sacrificial layer 1106 to form the openings 1242, 1244, 1246 and 1248 in the sacrificial layer 1106. As shown in the top view of FIG. 18, the openings (e.g., 1244 and 1246) formed by the fourth patterning process and the openings (e.g., 1234 and 1236) formed by the third patterning process are arranged in an alternating manner.

The remaining photoresist layer shown in FIG. 17 may be removed by using suitable photoresist stripping techniques such as chemical solvent cleaning, plasma ashing, dry stripping and/or the like.

Figure 19A:
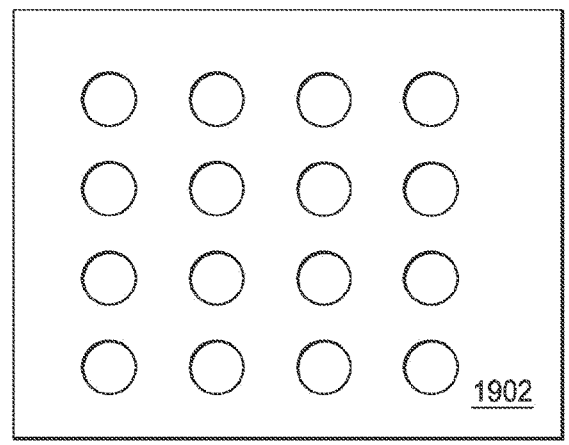
Figure 19B:
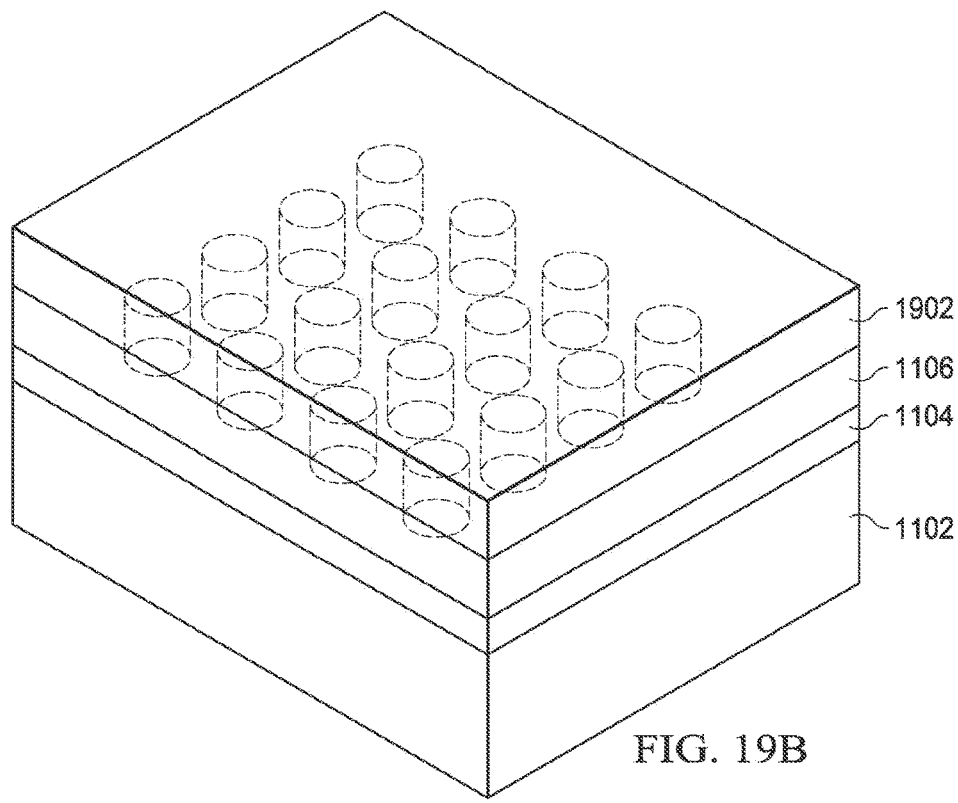

FIG. 19 illustrates a top view and a perspective view of the semiconductor device shown in FIG. 18 after a dielectric layer is formed over the semiconductor device in accordance with various embodiments of the present disclosure. As shown in FIG. 19, the sixteen openings are filled with the dielectric material. The dielectric layer 1902 may be formed of suitable dielectric materials such as high density plasma (HDP) silicon nitride (SiN) and/or the like. The dielectric layer 1902 may be formed by suitable deposition techniques such as CVD and/or the like.

Figure 20A:
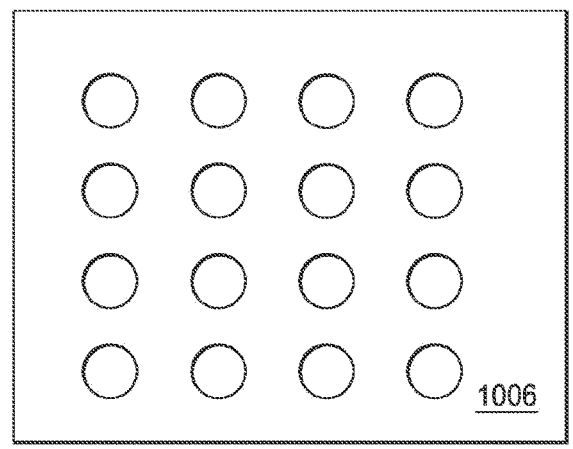
Figure 20B:
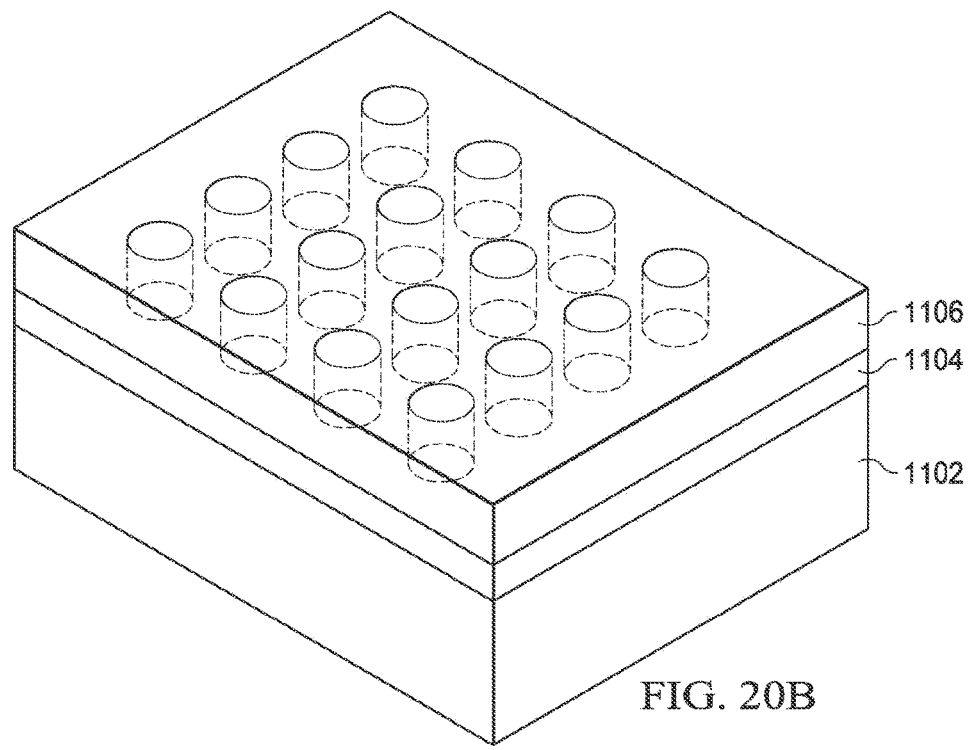

FIG. 20 illustrates a top view and a perspective view of the semiconductor device shown in FIG. 19 after a chemical mechanical polish (CMP) process is applied to the semiconductor device in accordance with various embodiments of the present disclosure. A planarization process such as a CMP process may be applied to the top surface of the semiconductor device. In the CMP process, a combination of etching materials and abrading materials are put into contact with the top side of the semiconductor device and a grinding pad (not shown) is used to grind away the HDP SiN layer until the sacrificial layer 1106 and the openings are exposed.

Figure 21A:
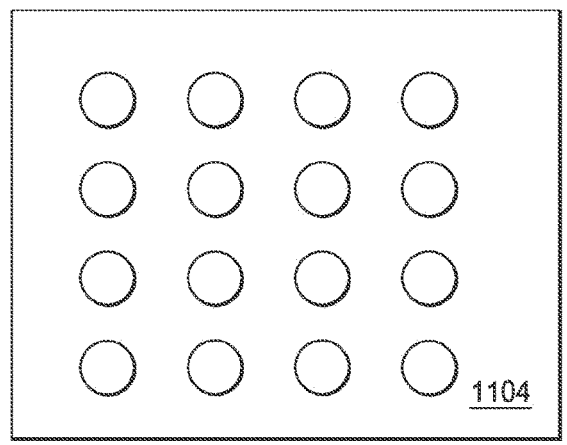
Figure 21B:
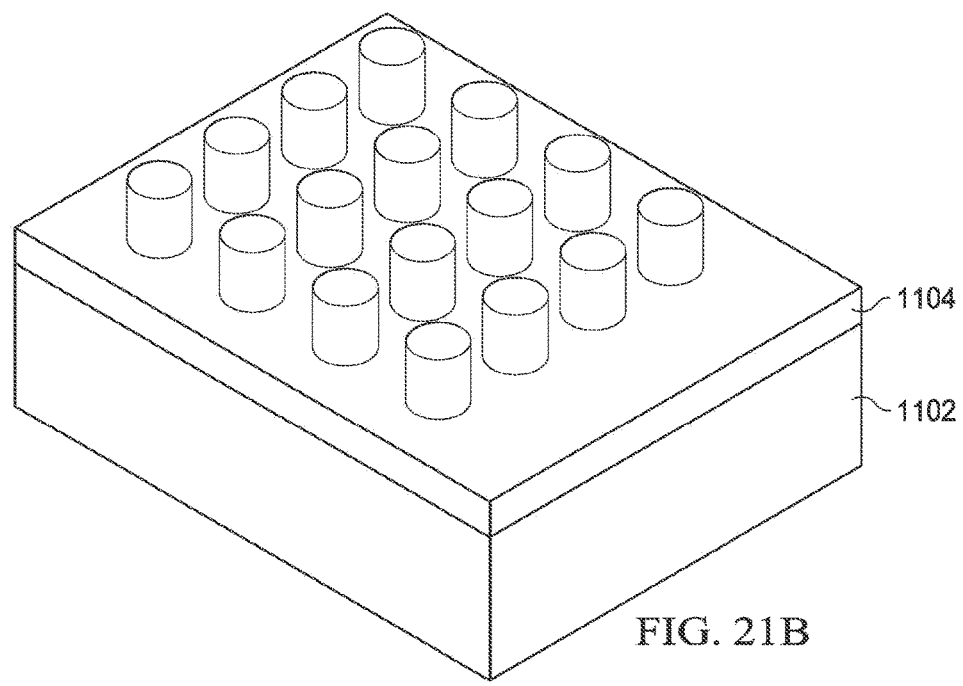

FIG. 21 illustrates a top view and a perspective view of the semiconductor device shown in FIG. 20 after an etching process is applied to the sacrificial layer of the semiconductor device in accordance with various embodiments of the present disclosure. The sacrificial layer 1106 shown in FIG. 20 may be removed by using a suitable etching process such as wet-etching, dry-etching and/or the like. The detailed operations of either the dry etching process or the wet etching process are well known in the art, and hence are not discussed herein to avoid repetition.

Figure 22A:
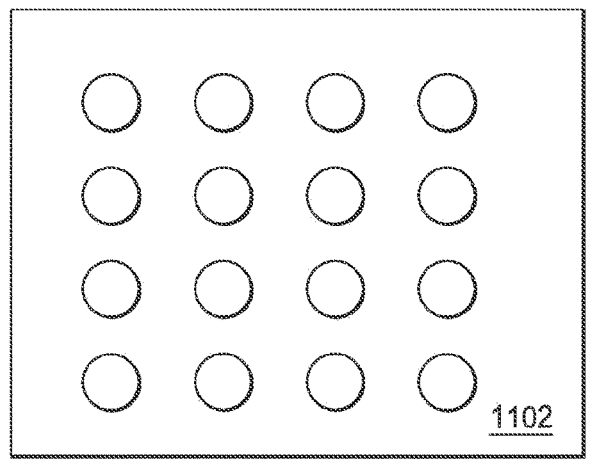
Figure 22B:
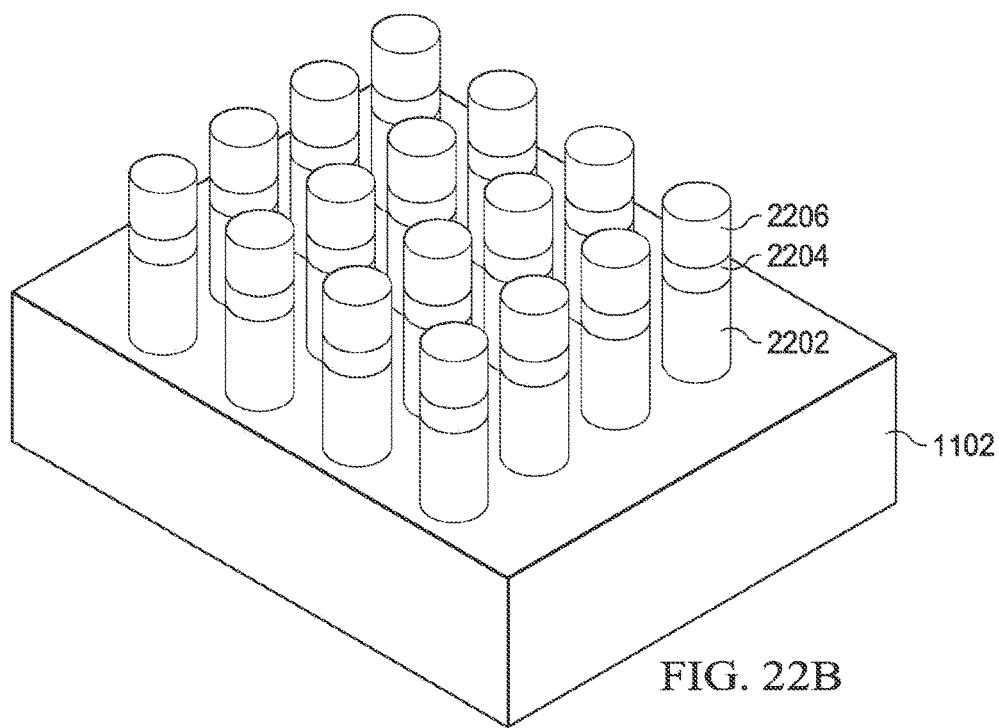

FIG. 22 illustrates a top view and a perspective view of the semiconductor device shown in FIG. 21 after an etching process is applied to the oxide layer and the substrate of the semiconductor device in accordance with various embodiments of the present disclosure. The oxide layer 1104 shown in FIG. 21 may be removed by using a suitable etching process such as wet-etching, dry-etching and/or the like.

A plurality of nanowires may be formed over the substrate 1102 by etching away the upper portion of the substrate 1102. As shown in FIG. 22, each nanowire comprises a silicon portion 2202, an oxide portion 2204 and a silicon nitride portion 2206.

Figure 23:
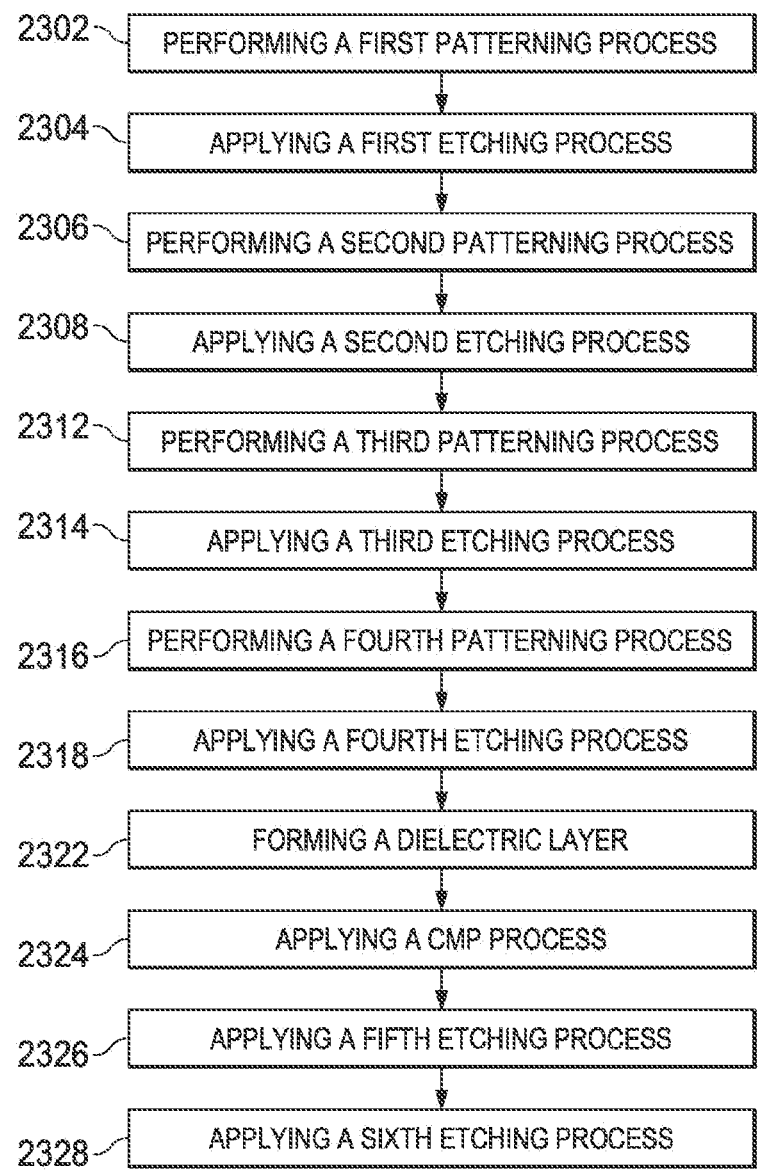
FIG. 23 illustrates a flow chart of a method for forming four vertical gate-all-around transistors through a quadruple patterning process in accordance with various embodiments of the present disclosure.

FIG. 23 illustrates a flow chart of a method for forming four vertical gate-all-around transistors through a quadruple patterning process in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 23 may added, removed, replaced, rearranged and repeated.

At step 2302, a first patterning process is applied to a semiconductor device. The semiconductor device includes a substrate, an oxide layer formed over the substrate and a sacrificial layer formed over the oxide layer. Selective areas of a first photoresist layer formed over the sacrificial layer are exposed to light. As a result, four openings are formed in the first photoresist layer.

At step 2304, a first etching process may be applied to the exposed portions of the sacrificial layer to form four openings in the sacrificial layer. The remaining photoresist layer may be removed by using suitable photoresist stripping techniques.

At step 2306, a second patterning process is applied to the semiconductor device. Selective areas of a second photoresist layer formed over the sacrificial layer are exposed to light. As a result, four openings are formed in the first photoresist layer. The openings formed in step 2306 are shifted in a y-direction from the openings formed in step 2302.

At step 2308, a second etching process may be applied to the exposed portions of the sacrificial layer to form the openings in the sacrificial layer. The remaining photoresist layer may be removed by using suitable photoresist stripping techniques. The openings formed by the second patterning process and the openings formed by the first patterning process are arranged in an alternating manner.

At step 2312, a third patterning process is applied to a semiconductor device. Selective areas of a third photoresist layer formed over the sacrificial layer are exposed to light. As a result, four openings are formed in the third photoresist layer. The openings formed in step 2312 are shifted in an x-direction from the openings formed in step 2306.

At step 2314, a third etching process may be applied to the exposed portions of the sacrificial layer to form four openings in the sacrificial layer. The remaining photoresist layer may be removed by using suitable photoresist stripping techniques. The openings formed by the third patterning process and the openings formed by the second patterning process are arranged in an alternating manner.

At step 2316, a fourth patterning process is applied to the semiconductor device. Selective areas of a fourth photoresist layer formed over the sacrificial layer are exposed to light. As a result, four openings are formed in the fourth photoresist layer. The openings formed in step 2316 are shifted in the y-direction from the openings formed in step 2312.

At step 2318, a fourth etching process may be applied to the exposed portions of the sacrificial layer to form four openings in the sacrificial layer. The remaining photoresist layer may be removed by using suitable photoresist stripping techniques. The openings formed by the fourth patterning process and the openings formed by the third patterning process are arranged in an alternating manner.

At step 2322, a dielectric layer may be formed over the semiconductor device. The dielectric layer may be formed of suitable dielectric materials such as high density plasma (HDP) silicon nitride (SiN) and/or the like. The dielectric layer may be formed by suitable deposition techniques such as CVD and/or the like.

At step 2324, a CMP process is applied to the semiconductor device. The CMP process is used to grind away the dielectric layer until the sacrificial layer and the openings are exposed.

At step 2326, a fifth etching process is applied to the sacrificial layer of the semiconductor device to remove the sacrificial layer. The fifth etching process may be a suitable etching process such as wet-etching, dry-etching and/or the like.

At step 2328, a sixth etching process is applied to the oxide layer and the substrate of the semiconductor device. The oxide layer and an upper portion of the substrate may be removed by using a suitable etching process such as wet-etching, dry-etching and/or the like.

In accordance with an embodiment, a method comprises depositing a sacrificial layer on a first dielectric layer over a substrate; applying a first patterning process, a second patterning process, a third patterning process to the sacrificial layer to form a first group of openings, a second group of openings and a third group of openings, respectively, in the sacrificial layer, wherein three first openings from three different patterning processes form a first side, a second side and a first angle between the first side and the second side and three second openings from the three different patterning processes form a third side, a fourth side and a second angle between the third side and the fourth side, wherein the first angle is approximately equal to the second angle and forming nanowires based on the first group of openings, the second group of openings and the third group of openings.

In accordance with an embodiment, a method comprises depositing a sacrificial layer on a first dielectric layer over a substrate; applying a first patterning process, a second patterning process, a third patterning process to the sacrificial layer to form a first group of openings, a second group of openings and a third group of openings, respectively, in the sacrificial layer, wherein three first openings from three different patterning processes form a first triangle and three second openings from the three different patterning processes form a second triangle, wherein a first angle of the first triangle is approximately equal to a second angle of the second triangle and forming nanowires based on the first group of openings, the second group of openings and the third group of openings.

In accordance with an embodiment, a method comprises depositing a sacrificial layer on a first dielectric layer over a substrate and applying a first patterning process, a second patterning process, a third patterning process to the sacrificial layer to form a first group of openings, a second group of openings and a third group of openings, respectively, in the sacrificial layer, wherein three first openings from three different patterning processes form a first triangle having a first angle, three second openings from the three different patterning processes form a second triangle having a second angle and three third openings from the three different patterning processes form a third triangle having a third angle, wherein the first angle, the second angle and the third angle are approximately equal to each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a sacrificial layer on a first dielectric layer over a substrate;
applying a first patterning process, a second patterning process, a third patterning process to the sacrificial layer to form a first group of openings, a second group of openings and a third group of openings, respectively, in the sacrificial layer, wherein:
three first openings from three different patterning processes form a first side, a second side and a first angle between the first side and the second side; and
three second openings from the three different patterning processes form a third side, a fourth side and a second angle between the third side and the fourth side, and wherein the first angle is approximately equal to the second angle; and
forming nanowires based on the first group of openings, the second group of openings and the third group of openings.

2. The method of claim 1, further comprising:
forming a vertical gate-all-around transistor using a first nanowire formed in one of the first group of openings, a second nanowire formed in one of the second group of openings and a third nanowire formed in one of the third group of openings.

3. The method of claim 2, further comprising:
forming the first nanowire, the second nanowire and the third nanowire using three different masks.

4. The method of claim 1, wherein:
the nanowires are substantially circular in shape.

5. The method of claim 1, wherein:
a pitch between two adjacent nanowires is in a range from about 8 nm to about 20 nm.

6. The method of claim 1, further comprising:
forming a first drain/source region at a bottom portion of a nanowire;
forming a channel region over the first drain/source region; and
forming a second drain/source region over the channel region.

7. The method of claim 6, further comprising:
forming a gate dielectric layer wrapping around the channel region; and
forming a gate electrode wrapping around the gate dielectric layer.

8. The method of claim 1, wherein:
a length of the first side is substantially equal to a length of the third side; and
a length of the second side is substantially equal to a length of the fourth side.

9. A method comprising:
depositing a sacrificial layer on a first dielectric layer over a substrate;
applying a first patterning process, a second patterning process, a third patterning process to the sacrificial layer to form a first group of openings, a second group of openings and a third group of openings, respectively, in the sacrificial layer, wherein:
three first openings from three different patterning processes form a first triangle; and
three second openings from the three different patterning processes form a second triangle, wherein a first angle of the first triangle is approximately equal to a second angle of the second triangle; and
forming nanowires based on the first group of openings, the second group of openings and the third group of openings.

10. The method of claim 9, wherein:
three third openings from the three different patterning processes form a third triangle, wherein a third angle of the third triangle is approximately equal to the first angle of the first triangle.

11. The method of claim 9, wherein:
the first triangle has a first side oriented to a first direction and a second side oriented to a second direction, and wherein the first angle is between the first side of the first triangle and the second side of the first triangle; and the second triangle has a first side oriented to the first direction and a second side oriented to the second direction, and wherein the second angle is between the first side of the second triangle and the second side of the second triangle.

12. The method of claim 11, wherein:

a length of the first side of the first triangle is substantially equal to a length of the first side of the second triangle.

13. The method of claim 11, wherein:

a length of the second side of the first triangle is substantially equal to a length of the second side of the second triangle.

14. The method of claim 9, further comprising:

forming a first transistor using three nanowires formed in the three first openings; and forming a second transistor using three nanowires formed in the three second openings.

15. A method comprising:

depositing a sacrificial layer on a first dielectric layer over a substrate; and applying a first patterning process, a second patterning process, a third patterning process to the sacrificial layer to form a first group of openings, a second group of openings and a third group of openings, respectively, in the sacrificial layer, wherein:

three first openings from three different patterning processes form a first triangle having a first angle;

three second openings from the three different patterning processes form a second triangle having a second angle; and three third openings from the three different patterning processes form a third triangle having a third angle, wherein the first angle, the second angle and the third angle are approximately equal to each other.

16. The method of claim 15, further comprising:

forming three first nanowires based on the three first openings;

forming three second nanowires based on the three second openings; and forming three third nanowires based on the three third openings.

17. The method of claim 16, further comprising:

forming a first transistor using the three first nanowires.

18. The method of claim 17, wherein:

each nanowire of the three first nanowires comprises a first drain/source region, a channel region over the first drain/source region and a second drain/source region over the channel region.

19. The method of claim 18, further comprising:

forming a gate dielectric layer wrapping around the channel region; and forming a gate electrode wrapping around the gate dielectric layer.

20. The method of claim 19, further comprising:

forming a first pad electrically connected to the first drain/source region;

forming a second pad electrically connected to the channel region; and forming a third pad electrically connected to the second drain/source region, wherein the first pad, the second pad and the third pad are parallel to each other.

* * * * *